United States Patent
Sekiya

(10) Patent No.: US 10,964,572 B2
(45) Date of Patent: Mar. 30, 2021

(54) CONVEYANCE SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/853,942

(22) Filed: Apr. 21, 2020

(65) Prior Publication Data

US 2020/0343111 A1 Oct. 29, 2020

(30) Foreign Application Priority Data

Apr. 23, 2019 (JP) .............................. JP2019-081535

(51) Int. Cl.
| | |
|---|---|
| H01L 21/67 | (2006.01) |
| B65G 43/10 | (2006.01) |
| B65G 49/07 | (2006.01) |
| H01L 21/677 | (2006.01) |
| B65G 37/02 | (2006.01) |
| B65G 35/06 | (2006.01) |

(52) U.S. Cl.
CPC .......... *H01L 21/6773* (2013.01); *B65G 35/06* (2013.01); *B65G 37/02* (2013.01); *B65G 2201/0297* (2013.01)

(58) Field of Classification Search
CPC ......... B65G 43/10; B65G 49/07; H01L 21/67; H01L 21/6773; B28D 5/00
USPC ...... 198/341.01, 341.02, 341.05, 346.3, 456; 414/222.02
See application file for complete search history.

(56) References Cited

U.S. PATENT DOCUMENTS

| | | | | |
|---|---|---|---|---|
| 5,388,945 A | * | 2/1995 | Garric | G03F 7/70541 414/217.1 |
| 5,868,545 A | * | 2/1999 | Kasai | B23P 19/001 414/331.12 |
| 8,086,341 B2 | * | 12/2011 | Spangler | G05B 19/41815 700/116 |
| 8,287,222 B2 | * | 10/2012 | Sawado | H01L 21/67724 414/279 |
| 8,726,811 B2 | * | 5/2014 | Kobayashi | B61B 3/00 104/89 |

(Continued)

FOREIGN PATENT DOCUMENTS

JP         06177244 A         6/1994

OTHER PUBLICATIONS

US 2004/0126208 A1, Tawyer et al., Jul. 1, 2004.*

*Primary Examiner* — Douglas A Hess
(74) *Attorney, Agent, or Firm* — Greer Burns & Crain, Ltd.

(57) ABSTRACT

A conveyance system for conveying a workpiece to each of a plurality of processing apparatuses includes a conveyance passage disposed in a space directly above one processing apparatus of the plurality of processing apparatuses, an automated conveying vehicle for traveling on the conveyance passage, the automated conveying vehicle including a workpiece storage member having a housing space for housing a workpiece therein, a traveling member having a storage space for storing the workpiece storage member therein, a traveling mechanism mounted on the traveling member, a lifting and lowering mechanism disposed in the traveling member for lifting and lowering the workpiece storage member while suspending the workpiece storage member from above, and a receiver for receiving control signals.

4 Claims, 22 Drawing Sheets

(56) References Cited

U.S. PATENT DOCUMENTS

| | | | |
|---|---|---|---|
| 9,086,697 B2* | 7/2015 | Suzuki | H01L 21/67733 |
| 9,520,313 B2* | 12/2016 | Ota | H01L 21/67769 |
| 9,633,881 B2* | 4/2017 | Rebstock | H01L 21/67769 |
| 9,881,824 B2* | 1/2018 | Ito | H01L 21/6773 |
| 10,170,379 B2* | 1/2019 | Sekiya | H01L 21/67092 |
| 10,622,236 B2* | 4/2020 | Kuo | H01L 21/681 |
| 10,717,605 B2* | 7/2020 | Sekiya | H01L 21/67346 |

* cited by examiner

CONVEYANCE SYSTEM

BACKGROUND OF THE INVENTION

Field of the Invention

The present invention relates to a conveyance system that conveys a workpiece to a processing apparatus.

Description of the Related Art

In a manufacturing step of device chips incorporated into electronic equipment and so forth, a plate-shaped workpiece typified by a semiconductor wafer or resin package substrate is processed by various kinds of processing apparatuses. When the workpiece is conveyed to this processing apparatus, normally a cassette for conveyance that can house plural workpieces is used.

Incidentally, in the above-described method in which plural workpieces are housed in the cassette and are conveyed to a processing apparatus at a time, unprocessed workpieces housed in the cassette are made to wait without exception when the processing apparatus stops due to any cause. That is, processing of the unprocessed workpieces by another processing apparatus also becomes impossible and thus the efficiency of the processing greatly lowers.

To solve this problem, for example, it is preferable to convey workpieces to a processing apparatus one by one according to the operation status of the processing apparatus. Thus, a conveyance system has been proposed in which plural processing apparatuses are coupled by a path for conveyance and a workpiece can be conveyed to each processing apparatus at an arbitrary timing (for example, refer to Japanese Patent Laid-open No. Hei 6-177244).

SUMMARY OF THE INVENTION

However, a conduit connecting part to which conduits are connected, a door for maintenance, and so forth are disposed on a side surface of each processing apparatus, and the path for conveyance needs to be designed in such a manner as not to interfere with them when the above-described conveyance system is constructed. For this reason, constructing the conveyance system is not necessarily easy and the path for conveyance also tends to become long.

Thus, an object of the present invention is to provide a conveyance system that can convey a workpiece to each of plural processing apparatuses and is also easy to construct.

In accordance with an aspect of the present invention, there is provided a conveyance system for conveying a workpiece to each of a plurality of processing apparatuses, including a conveyance passage disposed in a space directly above one processing apparatus of the plurality of processing apparatuses, an automated conveying vehicle for traveling on the conveyance passage, the automated conveying vehicle including a workpiece storage member having a housing space for housing the workpiece therein, a traveling member having a storage space for storing the workpiece storage member therein, a traveling mechanism mounted on the traveling member, a lifting and lowering mechanism disposed in the traveling member for lifting and lowering the workpiece storage member while suspending the workpiece storage member from above, and a receiver for receiving control signals, a stock unit including a workpiece storage member holding base for holding the workpiece storage member thereon when the workpiece is transferred from a workpiece stocker housing the workpiece therein to the workpiece storage member of the automated conveying vehicle, and a receiver for receiving control signals, and a control unit including a transmitter for transmitting control signals to the processing apparatuses, the automated conveying vehicle, and the stock unit, a receiver for receiving notification signals transmitted from the processing apparatuses, and a control signal generating section for generating control signals to be transmitted from the transmitter, in which the control signal generating section of the control unit generates control signals to be transmitted from the transmitter of the control unit on the basis of notification signals received by the receiver of the control unit, the transmitter of the control unit transmits the control signals generated by the control signal generating section of the control unit to the processing apparatuses, the automated conveying vehicle, and the stock unit, and the automated conveying vehicle travels, while storing the workpiece storage member in the storage space, on the conveyance passage on the basis of control signals received by the receiver, and when the automated conveying vehicle stops in a first vehicle stop region of the conveyance passage above the processing apparatuses or a second vehicle stop region of the conveyance passage above the stock unit, the lifting and lowering mechanism lifts and lowers the workpiece storage member to convey the workpiece storage member between the first vehicle stop region and an inside of the processing apparatus or between the second vehicle stop region and the workpiece storage member holding base of the stock unit.

In the conveyance system, preferably, the conveyance passage is disposed on upper surfaces of the processing apparatuses.

The conveyance system according to the aspect of the invention includes a conveyance passage disposed over a plurality of processing apparatuses, an automated conveying vehicle for traveling on the conveyance passage, the automated conveying vehicle including a workpiece storage member having a housing space for housing a workpiece therein, a traveling member having a storage space for storing the workpiece storage member therein, a traveling mechanism mounted on the workpiece storage member, a lifting and lowering mechanism disposed in the traveling member for lifting and lowering the workpiece storage member while suspending the workpiece storage member from above, and a receiver for receiving control signals, and a stock unit including a workpiece storage member holding base for holding the workpiece storage member thereon when the workpiece is transferred from a workpiece stocker housing workpieces therein to the workpiece storage member of the automated conveying vehicle, and a receiver for receiving control signals.

Therefore, the automated conveying vehicle can travel on the conveyance passage while storing the workpiece storage member in the storage space. Furthermore, the automated conveying vehicle stops in the first vehicle stop region of the conveyance passage above the processing apparatus or the second vehicle stop region of the conveyance passage above the stock unit, and the lifting and lowering mechanism lifts and lowers the workpiece storage member to convey the workpiece storage member between the first vehicle stop region and inside of the processing apparatus or between the second vehicle stop region and the workpiece storage member holding base of the stock unit.

Furthermore, in the conveyance system according to the aspect of the present invention, the conveyance passage is set in a space directly above the processing apparatus. For this reason, the structures of the side surfaces of each processing apparatus do not need to be considered when this conveyance passage is designed. That is, construction of the conveyance system becomes easy.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described with reference to the accompanying drawings. In the following respective embodiments, conveyance systems that convey workpieces and so forth to plural cutting apparatuses will be described. However, it suffices for the conveyance system of the present invention to be configured to be capable of conveying workpieces and so forth to plural processing apparatuses. That is, the conveyance destination of the workpiece and so forth may be a processing apparatus other than a cutting apparatus.

For example, the conveyance system of the present invention is configured to be capable of conveying workpieces to plural laser processing apparatuses in some cases. Furthermore, for example, the conveyance system of the present invention is configured to be capable of conveying a workpiece sequentially to plural kinds of processing apparatuses used for a series of processing in other cases. In the present description, all apparatuses that can be used in a series of steps for processing a workpiece will be referred to as processing apparatuses. Specifically, the processing apparatuses in the present invention include a tape sticking apparatus, an ultraviolet radiation applying apparatus, a cleaning apparatus, and so on that may not necessarily be aimed at processing a workpiece.

Embodiment 1

Figure 1:
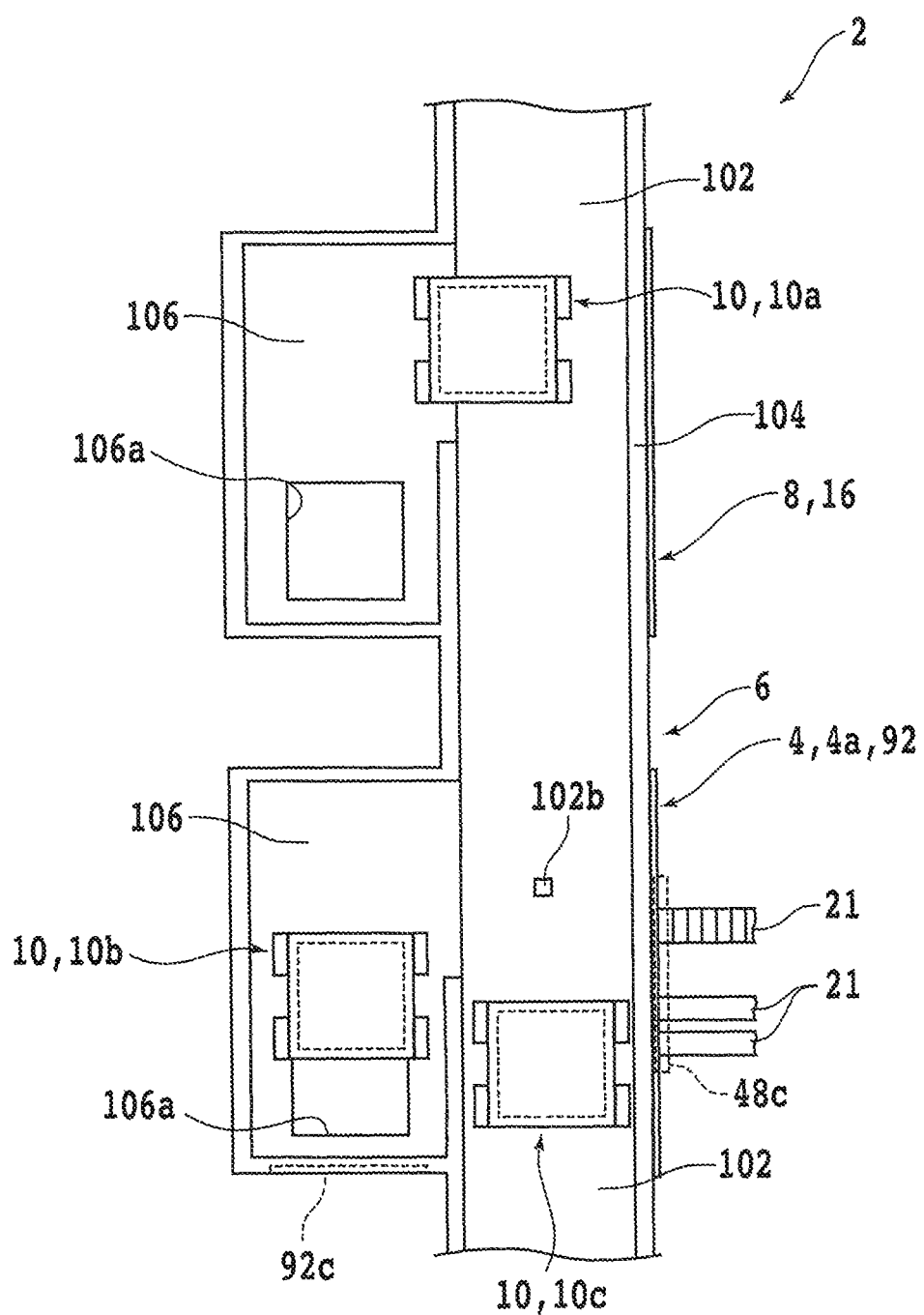
FIG. 1 is a plan view illustrating a configuration example of a conveyance system according to Embodiment 1.
Figure 2:
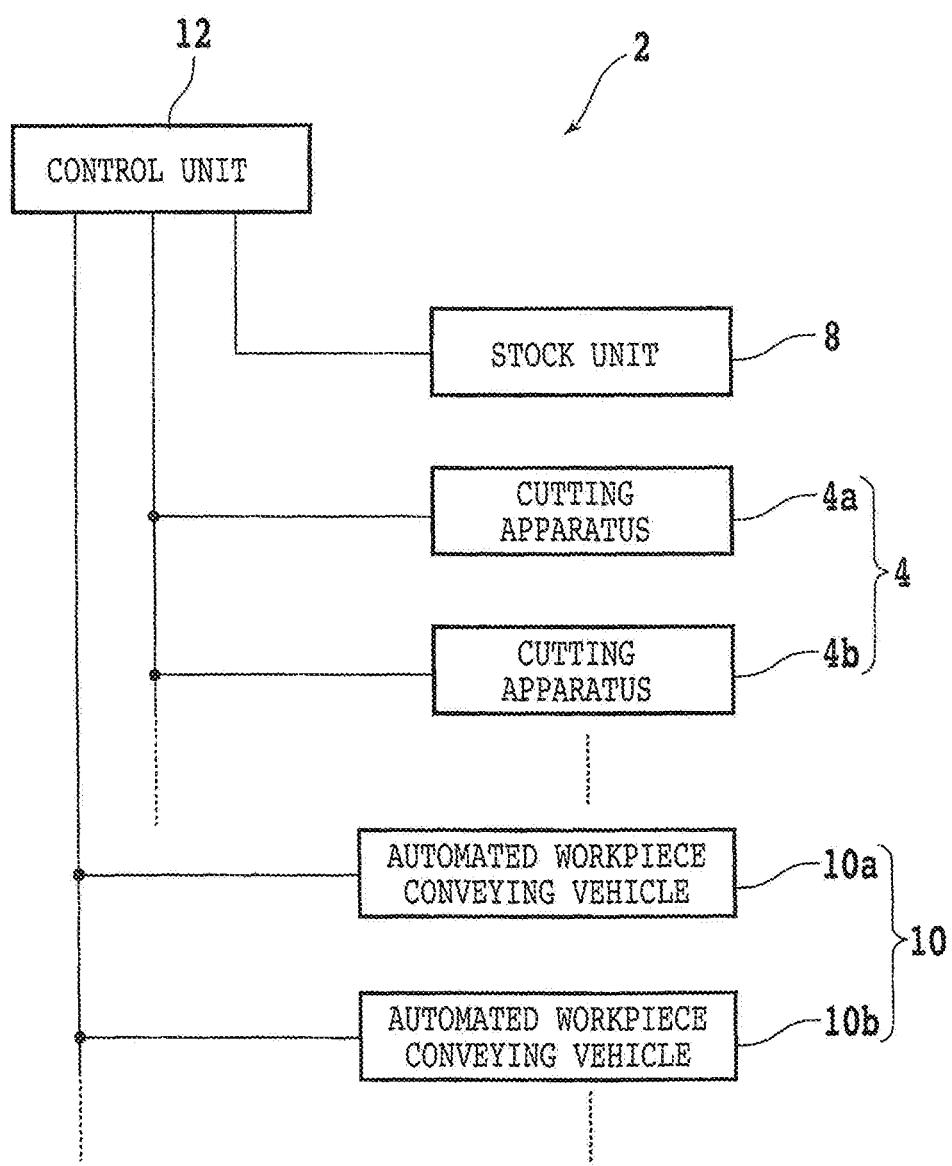
FIG. 2 is a functional block diagram illustrating an example of the connection relationship of the conveyance system according to Embodiment 1.

FIG. 1 is a plan view illustrating a configuration example of a conveyance system 2 according to the present embodiment and FIG. 2 is a functional block diagram illustrating an example of the connection relationship of the conveyance system 2. As illustrated in FIG. 1, the conveyance system 2 according to the present embodiment includes a conveyance passage 6 for conveying a plate-shaped workpiece 11 (see FIG. 4A, FIG. 4B, and so forth) processed by a cutting apparatus (processing apparatus) 4.

The workpiece 11 is a wafer that is composed of a semiconductor material such as silicon and has a circular disc shape, for example. The front surface side of this workpiece 11 is segmented into plural small regions by plural planned dividing lines (streets) intersecting each other and a device such as an integrated circuit (IC) or a micro electro mechanical system (MEMS) is formed in each small region.

A tape (dicing tape) 13 with a diameter larger than the workpiece 11 is stuck to the back surface side of the workpiece 11. The peripheral part of the tape 13 is fixed to a ring-shaped frame 15 that surrounds the workpiece 11. The workpiece 11 is conveyed to the cutting apparatus 4 in the state of being supported by the frame 15 with the intermediary of this tape 13.

Although the wafer that is composed of a semiconductor material such as silicon and has a circular disc shape is employed as the workpiece 11 in the present embodiment, there is no limit to the material, shape, structure, size, and so forth of the workpiece 11. For example, it is also possible to use a substrate or the like composed of a material such as another semiconductor, ceramic, resin, or metal as the workpiece 11.

Similarly, there is no limit also to the kind, quantity, shape, structure, size, arrangement, and so forth of the devices. The devices do not have to be formed on the workpiece 11. According to the present embodiment, the workpiece 11 supported on the frame 15 by the tape 13 is treated as a target to be conveyed. However, the workpiece 11 to which the tape 13 is not stuck, the workpiece 11 not supported on the frame 15, or the like may also be treated as a target to be conveyed.

Furthermore, the cutting apparatus 4 that processes this workpiece 11 is connected to the conveyance system 2 as the conveyance destination of the workpiece 11. However, the cutting apparatus 4 is not necessarily a constituent element of the conveyance system 2. Thus, the cutting apparatus 4 may be changed or omitted according to the form of use of the conveyance system 2 as described above.

Then, for convenience of description, only one cutting apparatus 4a is illustrated in FIG. 1 and two cutting apparatuses 4a and 4b are illustrated in FIG. 2. However, in the present embodiment, two or more cutting apparatuses 4 are necessary as the conveyance destination of the workpiece 11. That is, the number of processing apparatuses connected to the conveyance system 2 is two or more.

The conveyance passage 6 is disposed across plural cutting apparatuses 4 so that the workpiece 11 can be conveyed to each cutting apparatus 4. That is, the plural cutting apparatuses 4 are coupled to each other through the conveyance passage 6. Furthermore, the conveyance passage 6 is disposed in a space directly above the cutting apparatus 4. For this reason, the conveyance passage 6 does not interfere with conduits 21 and so forth connected to a side surface of each cutting apparatus 4.

Below the conveyance passage 6, a stock unit 8 that can house plural workpieces 11 is disposed besides the cutting apparatus 4. The workpiece 11 housed in the stock unit 8 is carried in to an automated workpiece conveying vehicle (automated conveying vehicle) 10 at an arbitrary timing. The automated workpiece conveying vehicle 10 travels on the conveyance passage 6 and conveys the workpiece 11 to each cutting apparatus 4. Although three automated workpiece conveying vehicles 10a, 10b, and 10c are illustrated in FIG. 1 and two automated workpiece conveying vehicles 10a and 10b are illustrated in FIG. 2, there is no limit to the number of automated workpiece conveying vehicles 10.

As illustrated in FIG. 2, to the cutting apparatuses 4, the stock unit 8, and the automated workpiece conveying vehicles 10, a control unit 12 that controls operation of them is wirelessly connected. However, it suffices for the control unit 12 to be configured to be capable of controlling operation of the cutting apparatuses 4, the stock unit 8, and the automated workpiece conveying vehicles 10 and the control unit 12 may be connected to them in a wired manner in some cases.

Figure 3:
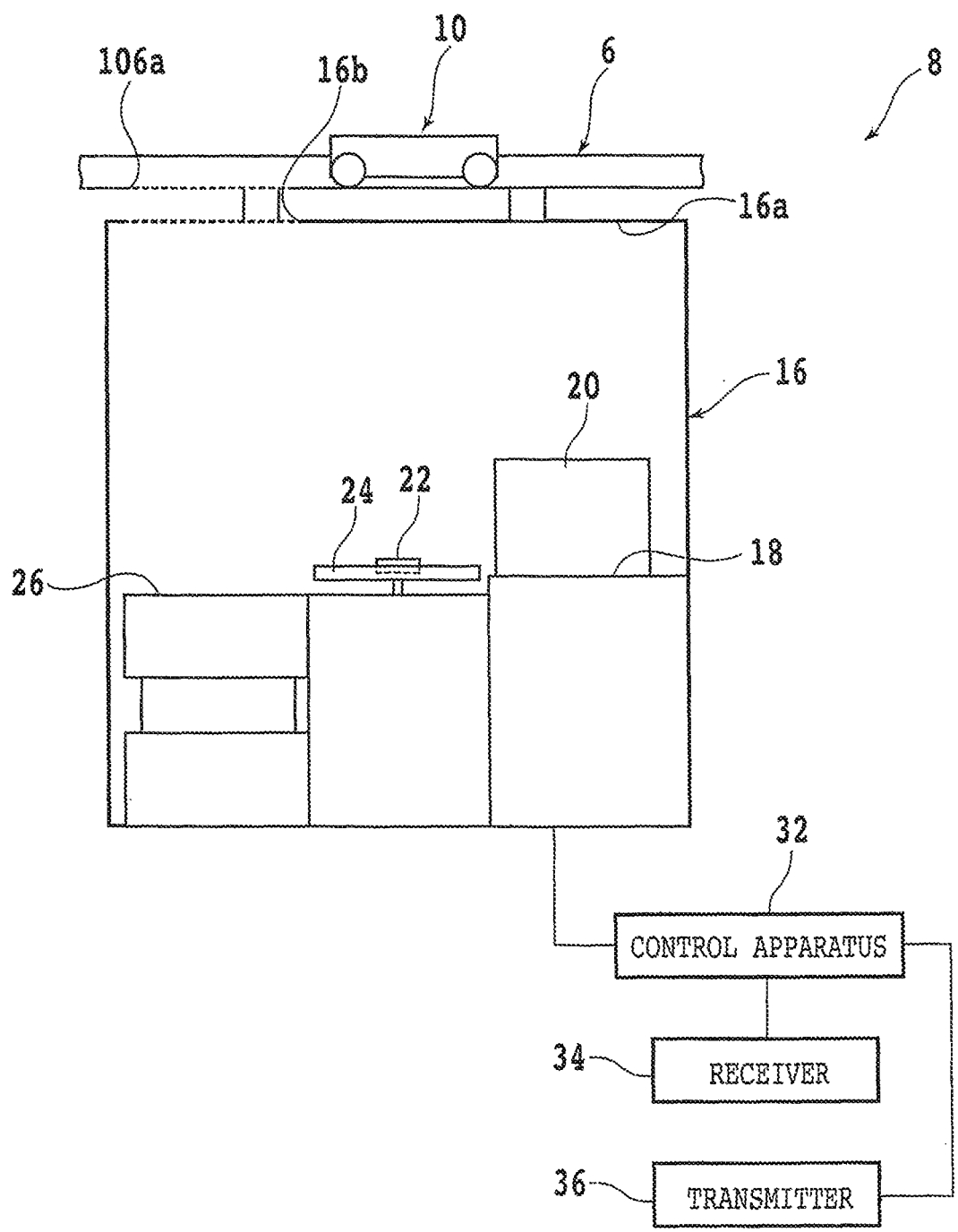
FIG. 3 is a side view schematically illustrating a configuration example of a stock unit according to Embodiment 1.

FIG. 3 is a side view schematically illustrating a configuration example of the stock unit 8. As illustrated in FIG. 3, the stock unit 8 includes a casing 16 that houses various constituent elements. In this FIG. 3, only the contour of the casing 16 is illustrated for convenience of description.

In the casing 16, a cassette holding base 18 that moves up and down by a first raising-lowering mechanism (not illustrated) of a ball screw type is disposed, for example. A cassette (workpiece stocker) 20 that can house plural workpieces 11 is placed on the upper surface of the cassette holding base 18. This cassette 20 houses the workpieces 11 in the state of being supported by the frame 15 with the intermediary of the tape 13 as described above.

A push-pull arm 22 that can move while grasping the frame 15 is disposed on a lateral side of the cassette holding base 18. For example, when the height of the frame 15 housed in the cassette 20 is adjusted to the height of the push-pull arm 22 by the first raising-lowering mechanism and the frame 15 in the cassette 20 is grasped by this push-pull arm 22, the frame 15 can be drawn out to the outside of the cassette 20.

A pair of guide rails 24 made to get closer to and further away from each other while the state in which the guide rails 24 are parallel to each other is kept are disposed at positions that sandwich the push-pull arm 22. Each guide rail 24 includes a support surface that supports the frame 15 from the lower side and a side surface substantially perpendicular to the support surface. The guide rails 24 sandwich the frame 15 drawn out of the cassette 20 by the push-pull arm 22 and adjust the frame 15 to a predetermined position.

On a lateral side of the push-pull arm 22 and the pair of guide rails 24, a workpiece storage member holding base 26 that moves up and down by a second raising-lowering mechanism (not illustrated) of a ball screw type is disposed, for example. A workpiece storage member 38 (see FIG. 4A, FIG. 4B, and so forth) of the automated workpiece conveying vehicle 10 that can house the workpiece 11 (frame 15) is placed on the upper surface of this workpiece storage member holding base 26.

The frame 15 that has been aligned with a predetermined position by the pair of guide rails 24 is gripped again by the push-pull arm 22, and inserted laterally into the workpiece storage member 38 on the workpiece storage member holding base 26 whose height has been adjusted by the second lifting and lowering mechanism. A position regulating member, not illustrated, for regulating the position of the workpiece storage member 38 is disposed on an upper surface of the workpiece storage member holding base 26. When a workpiece 11 is transferred from the cassette 20 that houses workpieces 11 therein to the workpiece storage member 38 of the automated workpiece conveying vehicle 10, therefore, the workpiece storage member 38 is positioned in a predetermined position determined by the position regulating member on the workpiece storage member holding base 26.

The casing 16 has an opening 16b defined in a ceiling 16a thereof and extending vertically therethrough in a region directly above the workpiece storage member holding base 26. The opening 16b is of such a shape and size that allow at least the workpiece storage member 38 of the automated workpiece conveying vehicle 10 placed on the workpiece storage member holding base 26 to pass therethrough. The workpiece storage member 38 is conveyed from outside of the casing 16 into the casing 16 through the opening 16b or from inside of the casing 16 out of the casing 16 through the opening 16b.

A control apparatus 32 for controlling operation of the stock unit 8 is connected to constituent elements such as the first raising-lowering mechanism, the push-pull arm 22, the pair of guide rails 24, and the second raising-lowering mechanism.

Typically, the control apparatus 32 is formed of a computer including a processing apparatus such as a central processing unit (CPU) and a storing apparatus such as a flash memory, and functions of the control apparatus 32 are implemented by causing the processing apparatus and so forth to operate in accordance with software stored in the storing apparatus.

A receiver 34 that receives a signal for control (control signal) transmitted from the control unit 12 of the conveyance system 2 and a transmitter 36 that transmits a signal for notification (notification signal) to the control unit 12 are further connected to the control apparatus 32. The control apparatus 32 controls the operation of the stock unit 8 based on the signal received by the receiver 34. Furthermore, the control apparatus 32 transmits the necessary signal to the control unit 12 through the transmitter 36.

Figure 4A:
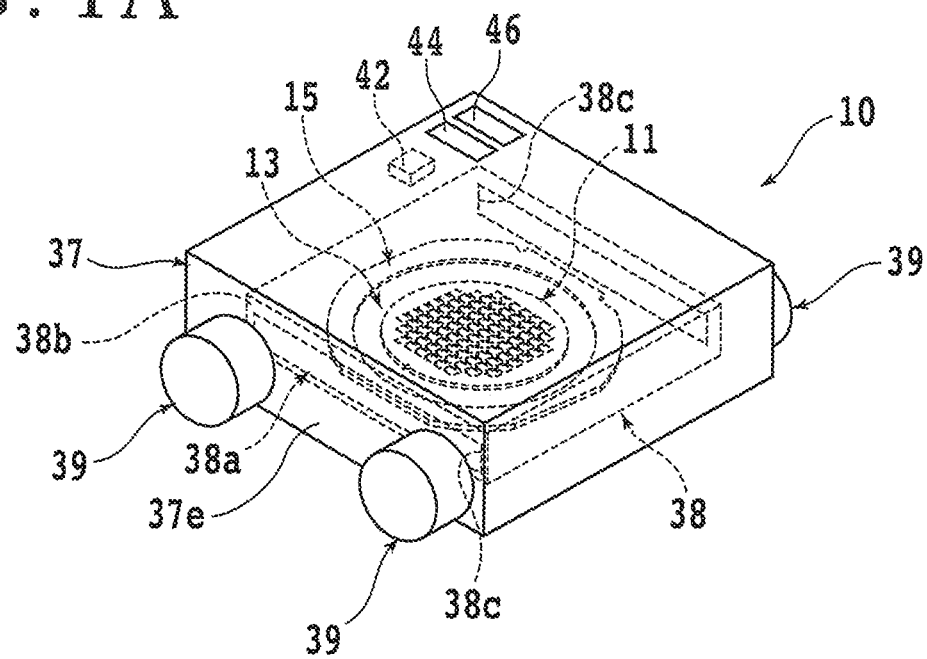
FIG. 4A is a perspective view schematically illustrating a configurational example of an automated workpiece conveying vehicle according to Embodiment 1.
Figure 4B:
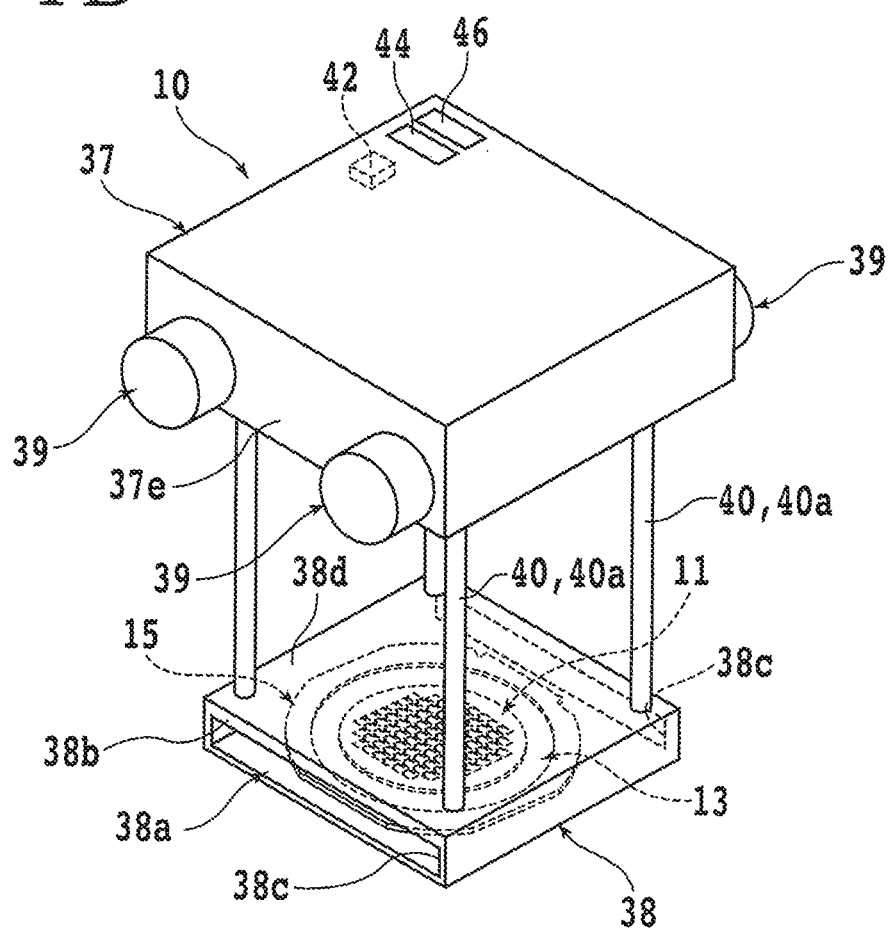
FIG. 4B is a perspective view illustrating the manner in which a workpiece storage member of the automated workpiece conveying vehicle is lifted and lowered.

FIG. 4A is a perspective view schematically illustrating a configurational example of the automated workpiece conveying vehicle 10, and FIG. 4B is a perspective view illustrating the manner in which the workpiece storage member 38 of the automated workpiece conveying vehicle 10 is lifted and lowered. As illustrated in FIGS. 4A and 4B, the automated workpiece conveying vehicle 10 includes a chassis (traveling member) 37 shaped as a rectangular parallelepiped, for example. The chassis 37 has a cavity 37b (see FIG. 13A, etc.) defined therein that is open at a lower surface 37a (see FIG. 13A, etc.) thereof.

The workpiece storage member 38 that is shaped as a rectangular parallelepiped for housing one workpiece 11 (and a frame 15) therein, for example, is stored in a space (storage space) 37c in the cavity 37b. The cavity 37b has an opening 37d which is of a size large enough to allow the workpiece storage member 38 to pass therethrough.

The workpiece storage member 38 has a space, i.e., a housing space, 38a defined therein for housing a workpiece 11 (and a frame 15). The workpiece storage member 38 has a pair of side surfaces 38b each having an opening 38c that is of a size large enough to allow a workpiece 11 (and a frame 15) to pass therethrough. The space 38a in the workpiece storage member 38 is connected to the outside through the openings 38c. Therefore, a workpiece 11 (and a frame 15) is (are) loaded into and out of the space 38a in the workpiece storage member 38 through the openings 38c.

The chassis 37 has a pair of side surfaces 37e lying parallel to each other. On each of the side surfaces 37e, there are disposed two wheels, i.e., traveling mechanisms, 39 having rotational shafts generally perpendicular to the side surface 37e. In other words, the automated workpiece conveying vehicle 10 has a total of four wheels 39. The wheels 39 are coupled to a rotational drive source such as an electric motor or the like, and are rotatable thereby.

When the wheels 39 are rotated by the rotational drive source, the automated workpiece conveying vehicle 10, i.e., the chassis 37, travels on the conveyance passage 6. The wheels 39 may be what is called mecanum wheels or the like each having a plurality of inclined barrel-shaped or tubular rotors mounted on an outer circumferential surface for contact with the conveyance passage 6. The mecanum wheels used as the wheels 39 allow the automated workpiece conveying vehicle 10 to move in any arbitrary directions simply by adjusting the rates at which the wheels 39 rotate.

The chassis 37 and the workpiece storage member 38 are coupled to each other by a plurality of (four in the present embodiment) lifting and lowering mechanisms 40 disposed in the space 37c in the cavity 37b. Each of the lifting and lowering mechanisms 40 includes a wire 40a and a winch 40b (see FIG. 13A, etc.) for winding the wire 40a, and is able to lift and lower the workpiece storage member 38 while suspending the workpiece storage member 38 from above.

Specifically, the winch 40b is fixed to an upper surface 37f as the bottom of the cavity 37b and connected to the proximal end of the wire 40a. The wire 40a has a distal end connected to an upper surface 38d of the workpiece storage member 38. When the winch 40b is operated to unwind the wire 40a, therefore, the workpiece storage member 38 is lowered and unloaded from the space 37c. On the other hand, when the winch 40b is operated to wind the wire 40a, the workpiece storage member 38 is lifted and stored in the space 37c.

The chassis 37 also houses therein a control apparatus 42 for controlling operation of the automated workpiece conveying vehicle 10. Typically, the control apparatus 42 is formed of a computer including a processing apparatus such as a CPU and a storing apparatus such as a flash memory, and functions of the control apparatus 42 are implemented by causing the processing apparatus and so forth to operate in accordance with software stored in the storing apparatus.

To this control apparatus 42, a receiver 44 that receives a signal for control (control signal) transmitted from the control unit 12 of the conveyance system 2 and a transmitter 46 that transmits a signal for notification (notification signal) to the control unit 12 are connected. The control apparatus 42 controls operation of the automated workpiece conveying vehicle 10 on the basis of signals received by the receiver 44. Furthermore, the control apparatus 42 transmits the necessary signal to the control unit 12 through the transmitter 46.

A secondary battery, for example, is connected to the above constituent elements including the rotational drive sources, the lifting and lowering mechanisms 40 (winch 40b), the control apparatus 42, the receiver 44, the transmitter 46, and so on. The constituent elements of the automated workpiece conveying vehicle 10 are actuated by electric power supplied from the secondary battery. The secondary battery should desirably be supplied (charged) with electric power by a non-contact (wireless or contactless) system. However, the secondary battery may be charged by a contact system.

Figure 5:
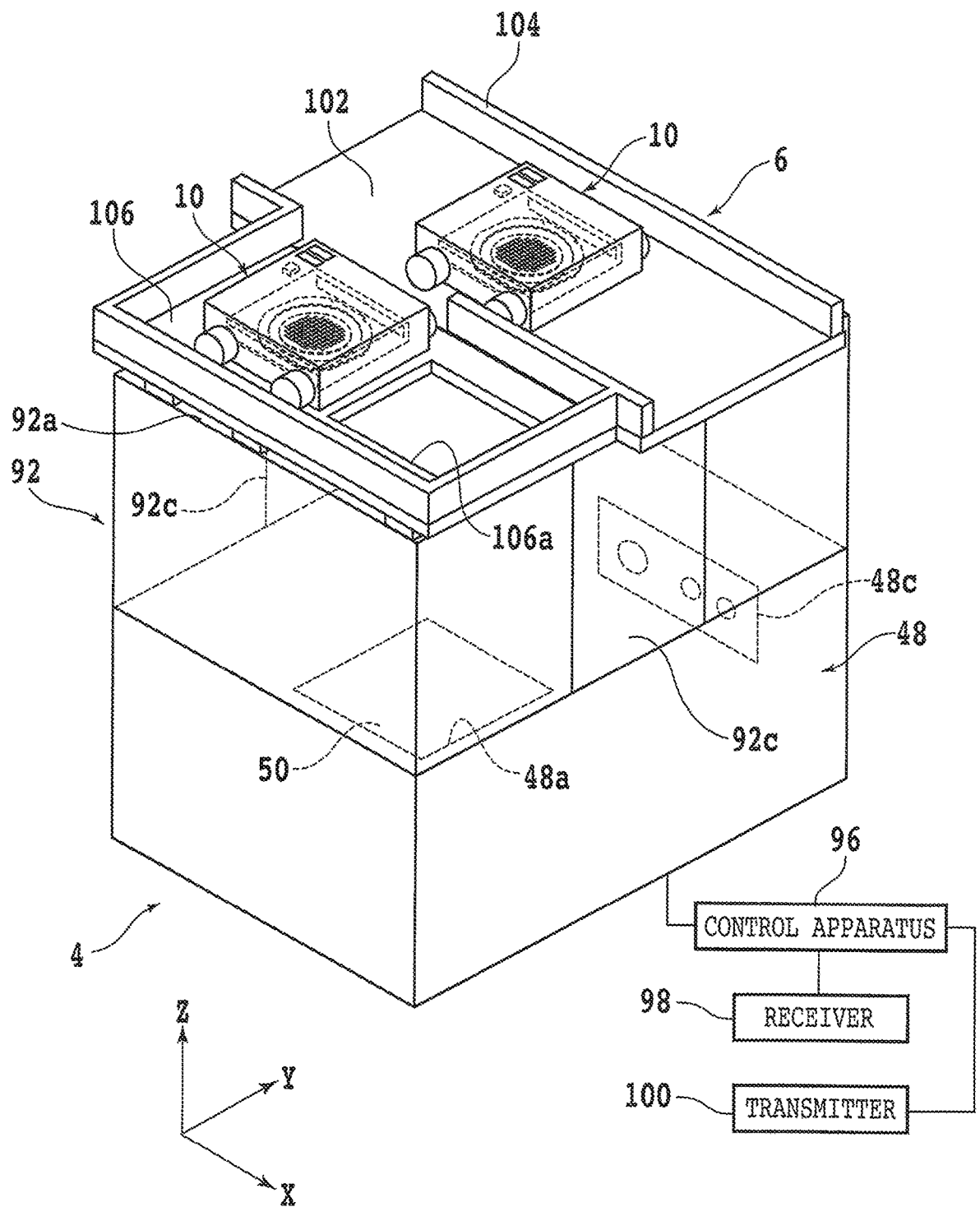
FIG. 5 is a perspective view illustrating the appearance of a cutting apparatus, a conveyance passage, and so forth according to Embodiment 1.
Figure 6:
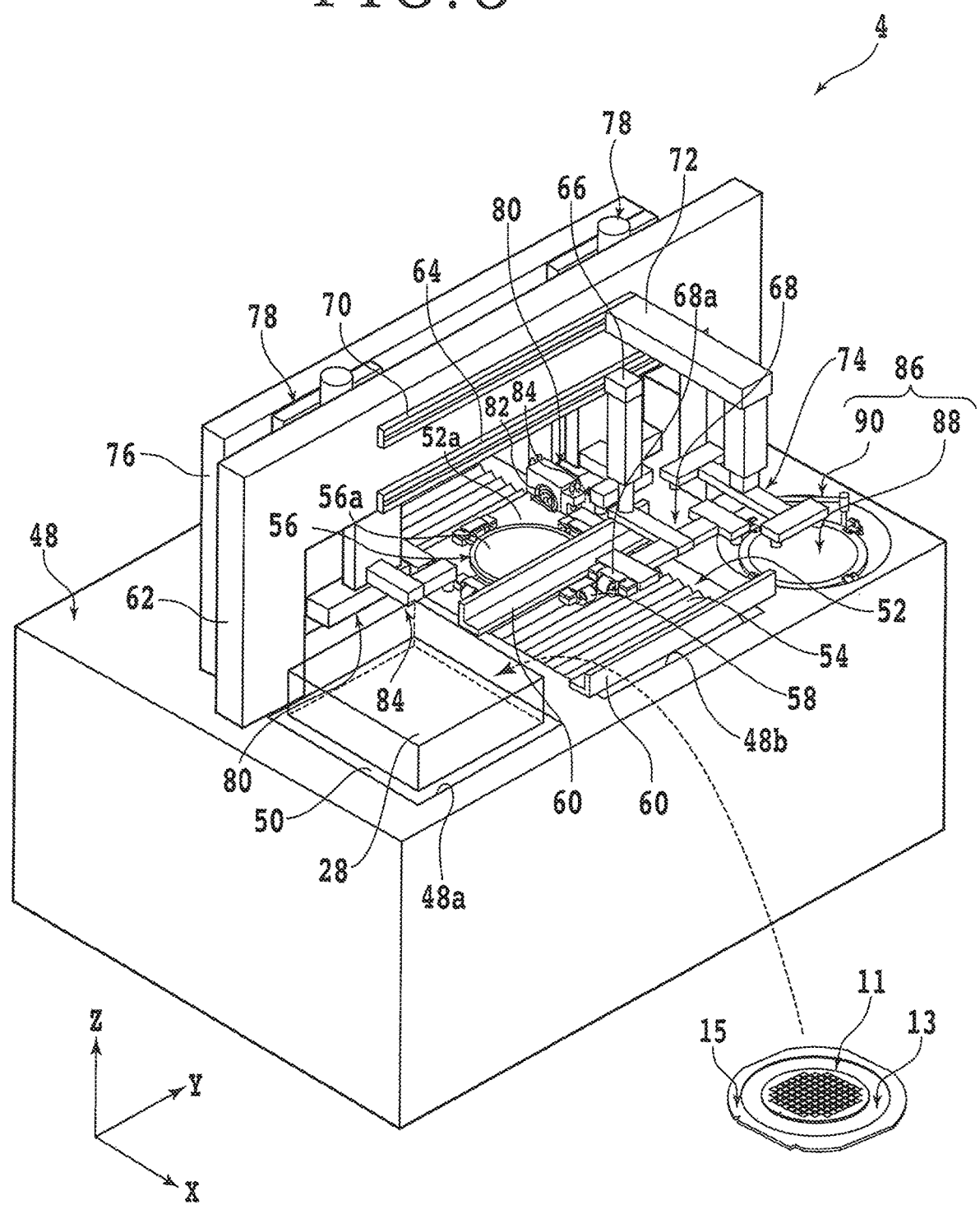
FIG. 6 is a perspective view illustrating a configuration example of the cutting apparatus.

FIG. 5 is a perspective view illustrating the appearance of the cutting apparatus 4, the conveyance passage 6, and so forth and FIG. 6 is a perspective view illustrating a configuration example of the cutting apparatus 4. As illustrated in FIG. 5 and FIG. 6, the cutting apparatus 4 includes a pedestal 48 that supports the respective constituent elements. The pedestal 48 has an opening 48a defined in a corner thereof, and a storage member holding base 50 that can be raised and lowered by a lifting and lowering mechanism (not illustrated).

The workpiece storage member 38 of the automated workpiece conveying vehicle 10 is placed on an upper surface of the workpiece storage member holding base 50. The upper surface of the workpiece storage member holding base 50 has the position regulating member (not illustrated) for regulating a position of the workpiece storage member 38. The workpiece storage member 38 on the workpiece storage member holding base 50 is positioned in a predetermined position determined by the position regulating member.

As illustrated in FIG. 6, an opening 48b that is long in an X-axis direction (front-rear direction, processing feed direction) is formed on a lateral side of the opening 48a. An X-axis movement mechanism (processing feed unit) 52 of a ball screw type and a dust-proof and drip-proof cover 54 that covers the upper part of the X-axis movement mechanism 52 are disposed in the opening 48b. The X-axis movement mechanism 52 includes an X-axis movement table 52a and moves this X-axis movement table 52a in the X-axis direction.

A chuck table (holding table) 56 that sucks and holds the workpiece 11 is disposed on the X-axis movement table 52a. The chuck table 56 is coupled to a rotational drive source (not illustrated) such as a motor and rotates around a rotation axis substantially parallel to a Z-axis direction (vertical direction, cutting-in feed direction). Furthermore, the chuck table 56 moves in the X-axis direction (processing feed) by the above-described X-axis movement mechanism 52.

The upper surface of the chuck table 56 functions as a holding surface 56a for holding the workpiece 11. The holding surface 56a is connected to a suction source (not illustrated) through a suction path (not illustrated) formed inside the chuck table 56 and so forth. Furthermore, four clamps 58 for fixing the frame 15 that supports the workpiece 11 from four sides are disposed around the chuck table 56.

Above the opening 48b, a pair of guide rails (temporary putting region) 60 made to get closer to and further away from each other while the state in which the guide rails 60 are parallel to a Y-axis direction (right-left direction, indexing feed direction) is kept are disposed. The pair of guide rails 60 each include a support surface that supports the frame 15 from the lower side and a side surface substantially perpendicular to the support surface. The guide rails 60 sandwich the frame 15 drawn out of the workpiece storage member 38 in the X-axis direction and adjust the frame 15 to a predetermined position.

A first support structure 62 with a gate shape is disposed to straddle the opening 48b over the pedestal 48. A first rail 64 along the Y-axis direction is fixed to the front surface of the first support structure 62 (surface on the side of the guide rails 60) and a first holding unit 68 is coupled to this first rail 64 with the intermediary of a first movement mechanism 66 and so forth.

For example, the first holding unit 68 gets contact with the upper surface of the frame 15 to suck and hold this frame 15 and moves up and down by the first movement mechanism 66. In addition, the first holding unit 68 moves in the Y-axis direction along the first rail 64. A grasping mechanism 68a for grasping the frame 15 is disposed on the first holding unit 68 on the side of the opening 48a.

For example, when the frame 15 is grasped by the grasping mechanism 68a and the first holding unit 68 is moved in the Y-axis direction, the frame 15 in the workpiece storage member 38 can be drawn out to the pair of guide rails 60 or the frame 15 on the pair of guide rails 60 can be inserted into the workpiece storage member 38. After the position of the frame 15 is adjusted by the pair of guide rails 60, this frame 15 (workpiece 11) is sucked and held by the first holding unit 68 and is carried in to the chuck table 56.

Furthermore, on the front surface of the first support structure 62, a second rail 70 along the Y-axis direction is fixed to the upper side of the first rail 64. A second holding unit 74 is coupled to this second rail 70 with the intermediary of a second movement mechanism 72 and so forth. For example, the second holding unit 74 gets contact with the upper surface of the frame 15 to suck and hold this frame 15 and moves up and down by the second movement mechanism 72. In addition, the second holding unit 74 moves in the Y-axis direction along the second rail 70.

A second support structure 76 with a gate shape is disposed on the rear side of the first support structure 62. Two sets of cutting units (processing units) 80 are each disposed on the front surface of the second support structure 76 (surface on the side of the first support structure 62) with the intermediary of a Y-axis/Z-axis movement mechanism (indexing feed unit, cutting-in feed unit) 78. The cutting unit 80 each moves in the Y-axis direction (indexing feed) and moves in the Z-axis direction (cutting-in feed) by the corresponding Y-axis/Z-axis movement mechanism 78.

Each cutting unit 80 includes a spindle (not illustrated) that serves as a rotating shaft substantially parallel to the Y-axis direction. A cutting blade 82 with a circular ring shape is mounted to one end side of each spindle. A rotational drive source (not illustrated) such as a motor is coupled to the other end side of each spindle. Furthermore, a nozzle for supplying a cutting liquid such as purified water to the workpiece 11 and the cutting blade 82 is disposed near the cutting blade 82.

While the cutting liquid is supplied from this nozzle, the rotated cutting blade 82 is caused to cut into the workpiece 11 held by the chuck table 56. Thereby, the workpiece 11 can be cut. An imaging unit (camera) 84 for imaging the workpiece 11 held by the chuck table 56 and so forth is disposed at a position adjacent to the cutting unit 80. This imaging unit 84 also moves in the Y-axis direction and moves in the Z-axis direction by the Y-axis/Z-axis movement mechanism 78.

A cleaning unit 86 is disposed at a position on the opposite side to the opening 48a across the opening 48b. The cleaning unit 86 includes a spinner table 88 that sucks and holds the workpiece 11 in a cleaning space with a cylindrical shape. A rotational drive source (not illustrated) that rotates the spinner table 88 at a predetermined speed is coupled to the lower part of the spinner table 88.

A spray nozzle 90 that sprays a fluid for cleaning (typically, mixed fluid obtained by mixing water and air) toward the workpiece 11 held by the spinner table 88 is disposed above the spinner table 88. The workpiece 11 can be cleaned by rotating the spinner table 88 that holds the workpiece 11 and spraying the fluid for cleaning from the spray nozzle 90.

After the workpiece 11 is cut by the cutting unit 80, the frame 15 is sucked and held by the second holding unit 74 and is conveyed to the cleaning unit 86, for example. After the workpiece 11 is cleaned by the cleaning unit 86, for example, the frame 15 is sucked and held by the first holding unit 68 to be placed on the pair of guide rails 60, and thereafter this frame 15 is grasped by the grasping mechanism 68a and is housed in the workpiece storage member 38.

As illustrated in FIG. 5, the upper surface side of the pedestal 48 is covered by a cover 92 and the above-described respective constituent elements are housed inside the cover 92. An opening 92b (see FIG. 7) that vertically penetrates a ceiling 92a of the cover 92 is made in a region directly above the opening 48a. The workpiece storage member 38 of the automated workpiece conveying vehicle 10 is conveyed from outside of the cover 92 into the cover 92 through the opening 92b or from inside of the cover 92 out of the cover 92 through the opening 92b. The opening 92b is not limited to any particular shape and size, but needs to be shaped and sized to allow at least the workpiece storage member 38 to pass therethrough.

The constituent elements of the cutting apparatus 4 described above are connected to a control apparatus 96 (FIG. 5). Typically, the control apparatus 96 is formed of a computer including a processing apparatus such as a CPU and a storing apparatus such as a flash memory, and functions of the control apparatus 96 are implemented by causing the processing apparatus and so forth to operate in accordance with software stored in the storing apparatus.

A receiver 98 that receives a signal for control (control signal) transmitted from the control unit 12 of the conveyance system 2 and a transmitter 100 that transmits a signal for notification (notification signal) to the control unit 12 are further connected to the control apparatus 96. The control apparatus 96 controls the respective constituent elements of the above-described cutting apparatus 4 based on the signal received by the receiver 98 and so forth, for example.

A conduit connecting part 48c (FIG. 5) to which various conduits 21 are connected is disposed in a sidewall of the pedestal 48. Furthermore, doors 92c (FIG. 5) opened and closed in maintenance or the like are disposed in a sidewall of the cover 92. Moreover, an operation panel (not illustrated), a display (not illustrated), and so forth may be disposed on a sidewall of the cover 92.

Figure 7:
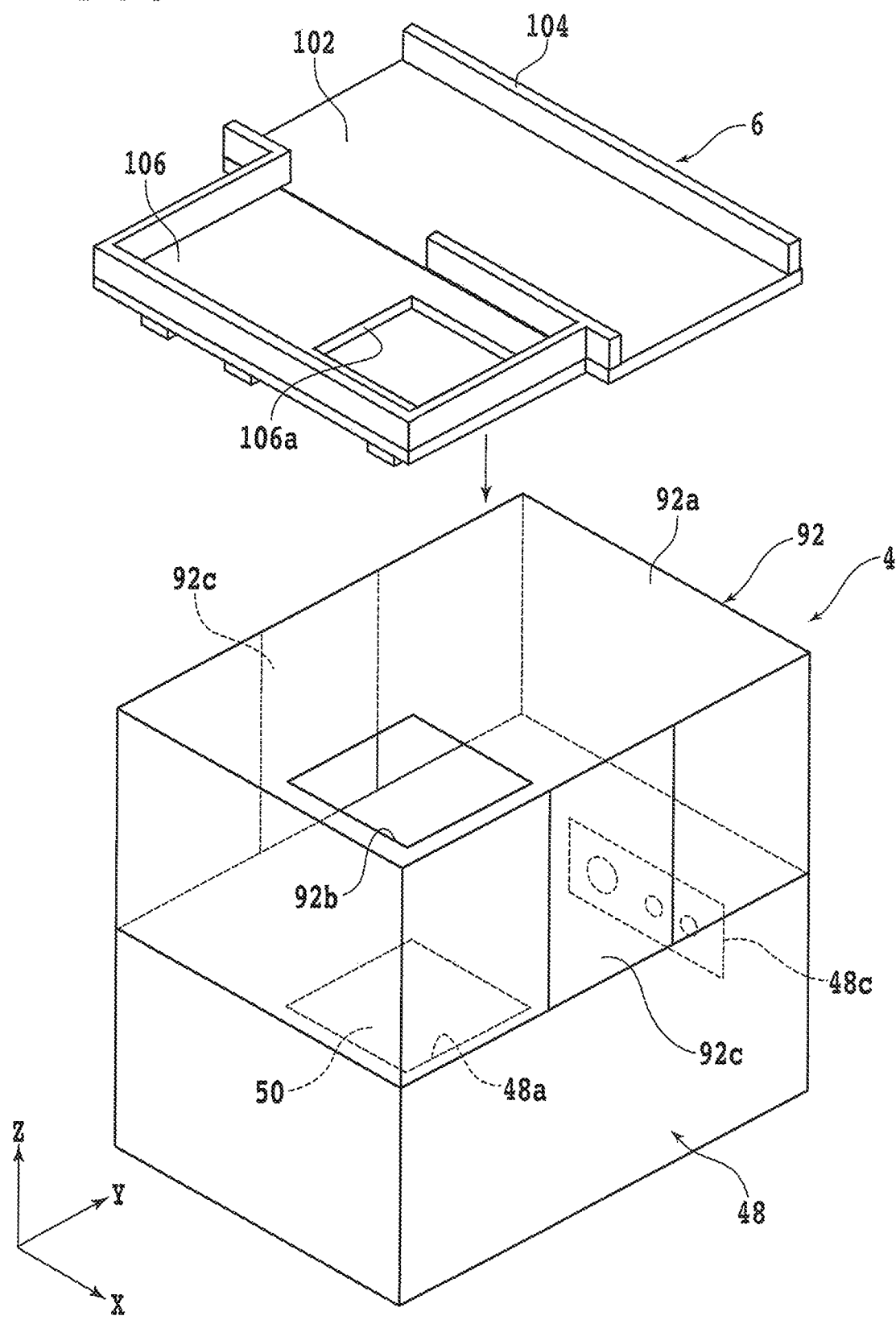
FIG. 7 is a perspective view illustrating how the conveyance passage is set on the cutting apparatus.

FIG. 7 is a perspective view illustrating how the conveyance passage 6 of the conveyance system 2 is set on the cutting apparatus 4. As illustrated in FIG. 7 and so forth, the conveyance passage 6 of the conveyance system 2 according to the present embodiment is mounted to the upper surface side of the ceiling 92a of the cover 92 which the cutting apparatus 4 has. That is, the conveyance passage 6 is set in a space directly above the cutting apparatus 4.

This eliminates interference of the conveyance passage 6 with the structures such as the conduit connecting part 48c and the doors 92c disposed in side surfaces of the cutting apparatus 4. That is, the structures of the side surfaces of the cutting apparatus 4 do not need to be considered when the conveyance passage 6 is designed. For this reason, construction of the conveyance system 2 becomes easy.

Figure 8A:
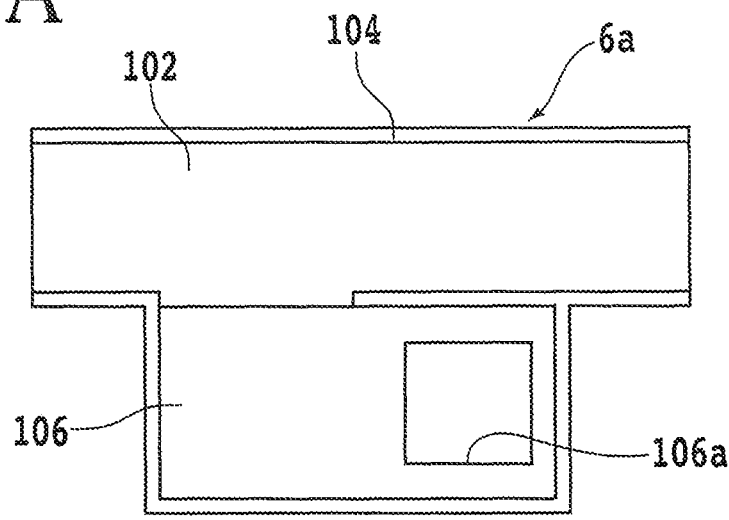
FIG. 8A, FIG. 8B, and FIG. 8C are plan views illustrating configuration examples of a passage module.
Figure 8B:
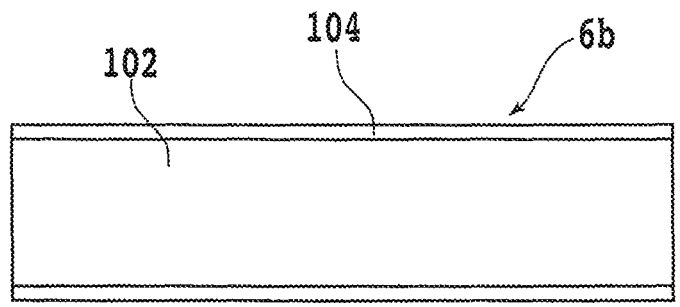
Figure 8C:
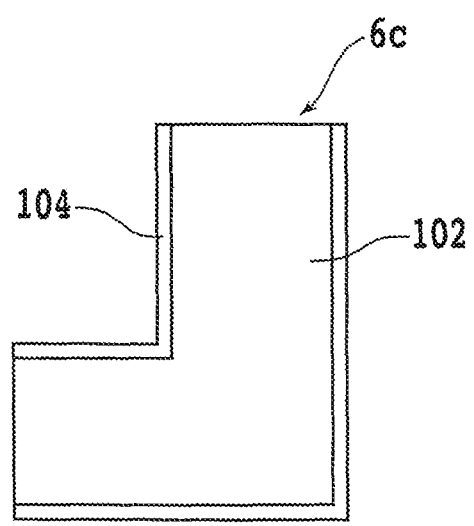

FIG. 8A is a plan view illustrating a configuration example of a passage module 6a used for the conveyance passage 6. FIG. 8B is a plan view illustrating a configuration example of a passage module 6b. FIG. 8C is a plan view illustrating a configuration example of a passage module 6c. The conveyance passage 6 is configured by combining the plural passage modules 6a, 6b, and 6c illustrated in FIG. 8A, FIG. 8B, and FIG. 8C, for example.

The respective passage modules 6a, 6b, and 6c each include a passage part 102 having an upper surface that is suitable for traveling of the automated workpiece conveying vehicle 10 and has high flatness and a guide part 104 that is disposed at ends of the passage part 102 in the width direction and is along this passage part 102. The height of the upper end of the guide part 104 from the passage part 102 is higher than the height of the wheels 39 of the automated workpiece conveying vehicle 10, for example. This can prevent the automated workpiece conveying vehicle 10 that travels on the passage part 102 from falling off from the passage part 102.

The passage module 6a of FIG. 8A further has a waiting part 106 for allowing the automated workpiece conveying vehicle 10 to wait, and is set directly above the cutting apparatus 4, the stock unit 8, or the like, for example. The waiting part 106 has an opening 106a defined therein that is of a size large enough to allow the workpiece storage member 38 to pass therethrough. With the passage module 6a being appropriately installed, the opening 106a is positioned directly above the opening 92b of the cutting apparatus 4 and an opening 16b of the stock unit 8.

The passage module 6b illustrated in FIG. 8B is of a straight shape, and the passage module 6c illustrated in FIG. 8C is of a right-angle shape suitable for use at a corner. The passage modules 6b and 6c are used to join adjacent two passage modules 6a, for example.

However, there is no limit to the kind, quantity, arrangement (relationship of the connection), and so forth of the passage module configuring the conveyance passage 6. For example, two passage modules 6a may be joined by yet another passage module 6a. Furthermore, for example, it is also possible to use a passage module with a circular arc shape (curved shape) instead of the passage module 6c with the right-angle shape. An electric power supply facility or electric charger for supplying electric power to the secondary battery of the automated workpiece conveying vehicle 10 may be disposed on the waiting part 106 or the like of the passage module 6a.

Figure 9:
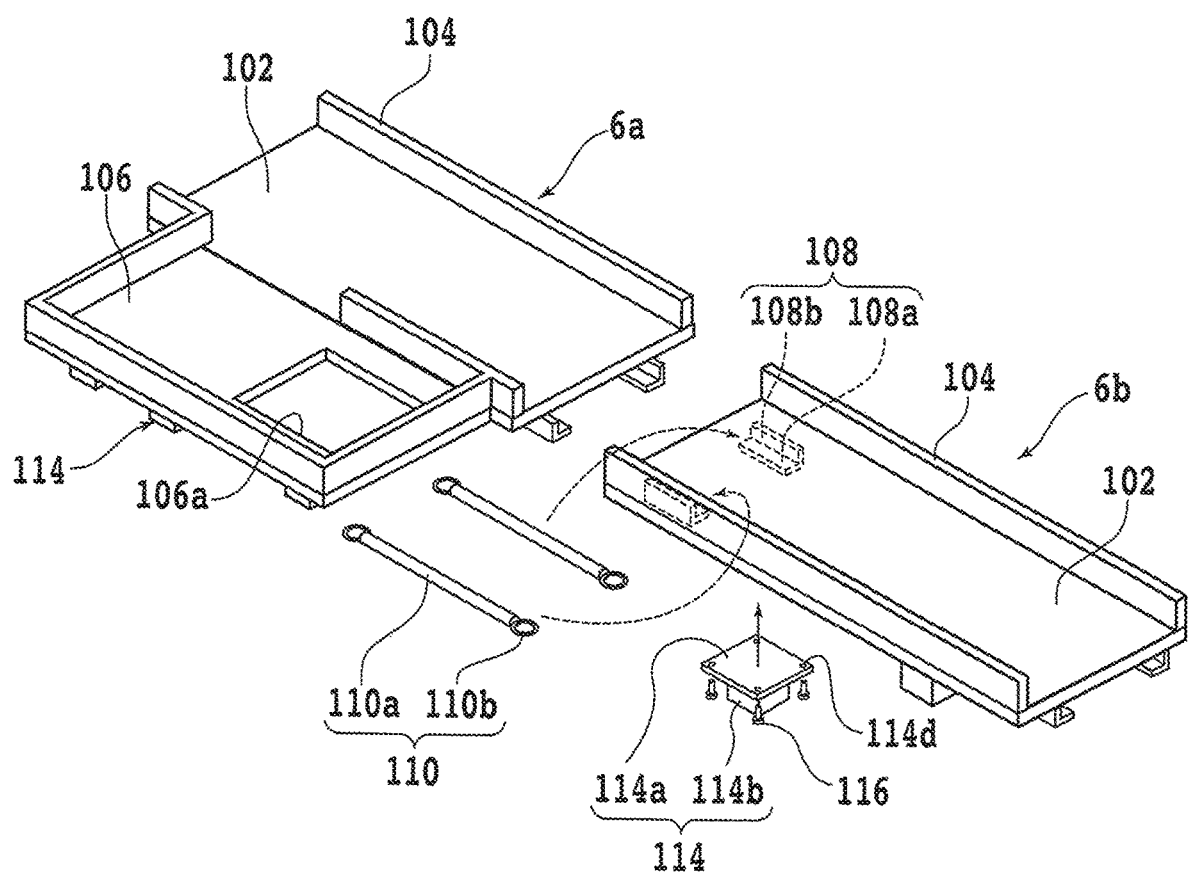
FIG. 9 is a perspective view illustrating how the conveyance passage is formed from the passage modules.
Figure 10A:
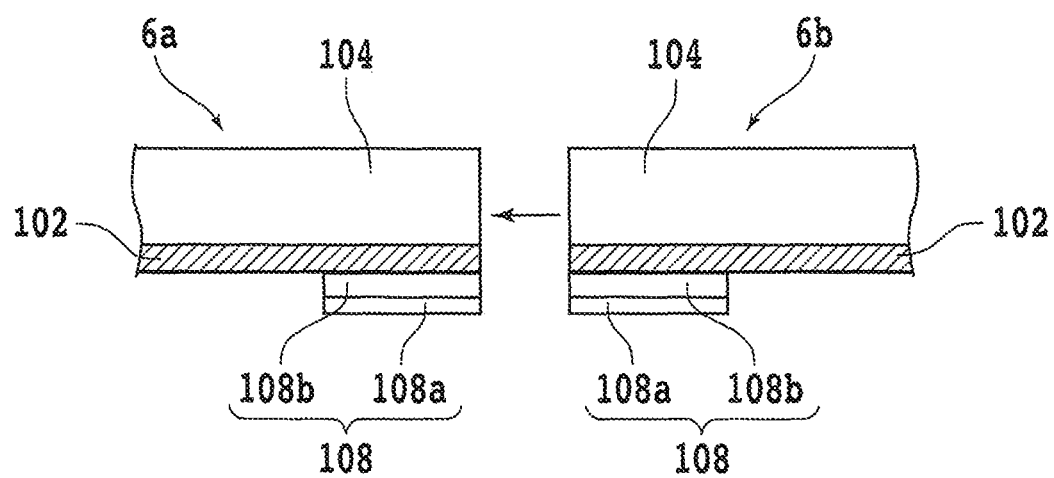
FIG. 10A and FIG. 10B are sectional views illustrating how the passage modules are coupled.
Figure 10B:
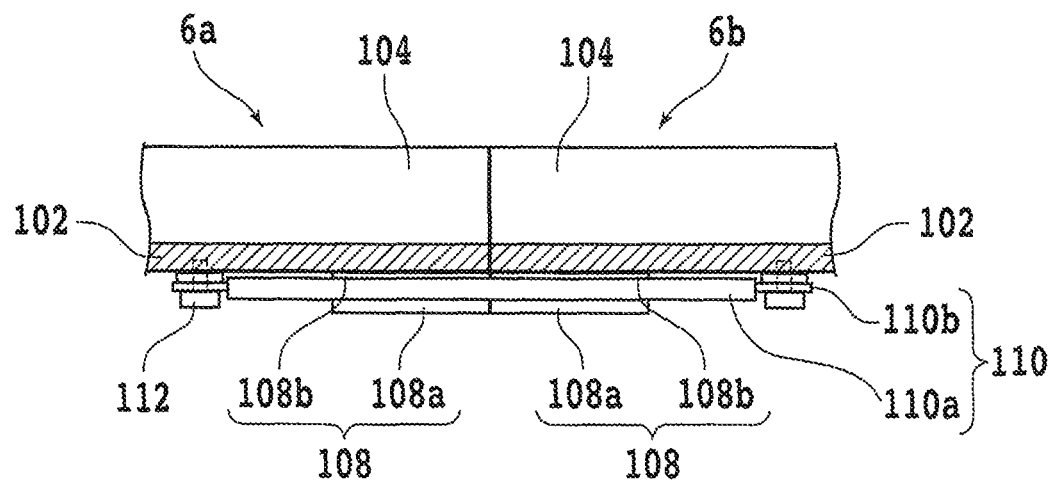
Figure 11:
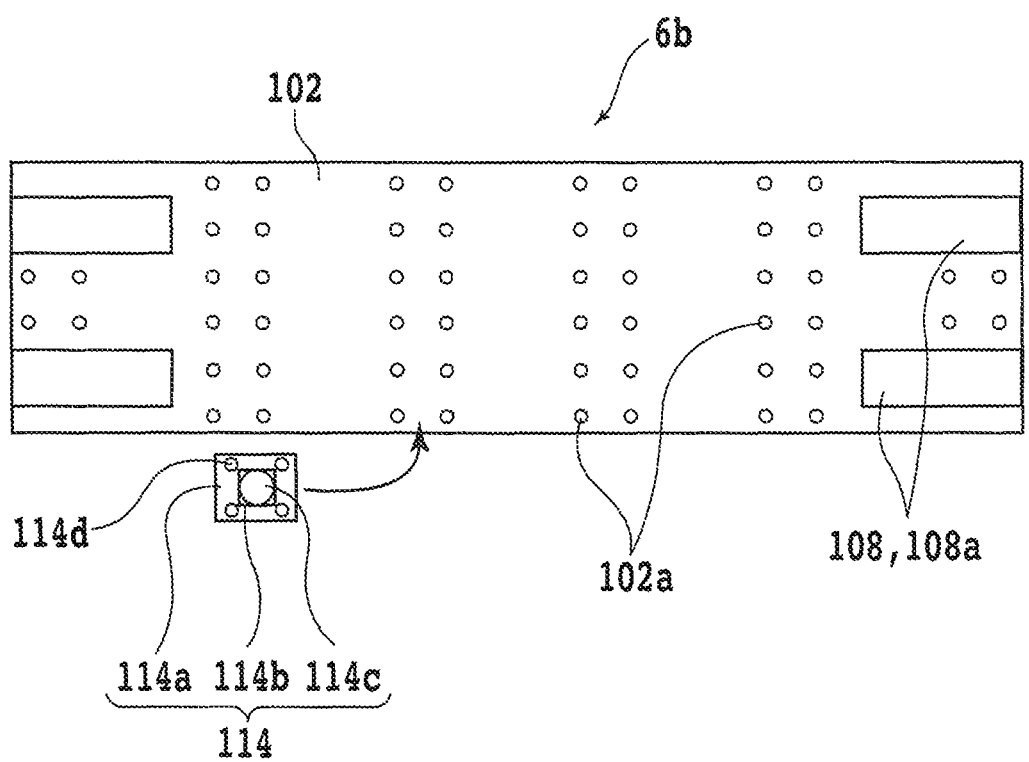
FIG. 11 is a bottom view illustrating a configuration example of the passage module.

FIG. 9 is a perspective view illustrating how the conveyance passage 6 is formed from the passage module 6a and the passage module 6b. FIG. 10A and FIG. 10B are sectional views illustrating how the passage module 6a and the passage module 6b are coupled. Furthermore, FIG. 11 is a bottom view illustrating a configuration example of the passage module 6b.

As illustrated in FIG. 9, a pair of angles (brackets) 108 whose section has an L-shape are disposed at an end part of the lower surface of the passage part 102 in the length direction (end part in the direction along the conveyance passage 6). Each angle 108 includes a substantially-horizontal support surface 108a and a side surface 108b substantially perpendicular to the support surface 108a, and is fixed to the lower surface of the passage part 102 in such a manner that the longitudinal direction of each angle 108 is along the conveyance passage 6.

When the passage module 6a and the passage module 6b are coupled, first, as illustrated in FIG. 10A, an end part of the passage part 102 configuring the passage module 6a in the longitudinal direction and an end part of the passage part 102 configuring the passage module 6b in the longitudinal direction are brought sufficiently close to each other. Then, as illustrated in FIG. 10B, coupling pieces 110 are each inserted into the angle 108 disposed on the passage part 102 configuring the passage module 6a and the angle 108 disposed on the passage part 102 configuring the passage module 6b.

For example, the coupling piece 110 includes a rod part 110a longer than the length obtained by adding the length of the angle 108 of the passage module 6a and the length of the angle 108 of the passage module 6b and ring parts 110b that are disposed at both ends of the rod part 110a and have an opening at the center. The rod parts 110a of these coupling pieces 110 are inserted into the angles 108.

After the rod parts 110a are inserted into the angles 108, bolts 112 are fastened into bolt holes (not illustrated) on the lower surface side of the passage part 102 through the openings of the ring parts 110b. This can couple the passage module 6a and the passage module 6b through the coupling pieces 110. The passage module 6c is also coupled to other passage modules (passage module 6a, passage module 6b, and so forth) by the same procedure.

Mounting of the passage modules 6a, 6b, and 6c to the cutting apparatus 4 is executed with the intermediary of a leg member 114 illustrated in FIG. 9, FIG. 11, and so forth, for example. The leg member 114 includes a plate-shaped base part 114a, a column part 114b that protrudes from the vicinity of the center of a surface of the base part 114a on one side and has a column shape, and a suction adhesion part 114c (FIG. 11) that is mounted to the tip of the column part 114b and has a suction cup shape.

In a region that does not overlap with the column part 114b in the base part 114a, four openings 114d that penetrate this base part 114a in the thickness direction are formed. Furthermore, in the lower surfaces of the passage parts 102 configuring the passage modules 6a, 6b, and 6c, bolt holes 102a (FIG. 11) corresponding to the respective openings 114d are formed.

Thus, when the surface of the base part 114a on the other side is brought into contact with the lower surface of the passage part 102 and bolts 116 are fastened into the bolt holes 102a through the openings 114d, the leg member 114 can be fixed to the passage module 6a, 6b, or 6c. There is no limit to the quantity, arrangement, and so forth of the openings 114d and the bolt holes 102a.

As illustrated in FIG. 11, four bolt holes 102a corresponding to four openings 114d of the base part 114a are formed in each of plural regions of the lower surface of the passage part 102 in the passage module 6b of the present embodiment, and the leg member 114 can be mounted to an arbitrary region. This is similar also to the other passage modules 6a and 6c.

That is, the leg member 114 is mounted to any region selected from the plural regions of the lower surface of the passage part 102. It is desirable to mount plural leg members 114 to each of the passage modules 6a, 6b, and 6c. This makes it easy to stabilize the position of the conveyance passage 6 relative to the cutting apparatus 4.

When the passage module 6a, 6b, or 6c is mounted to the cutting apparatus 4, for example, the position of the passage module 6a, 6b, or 6c is adjusted to the cover 92 of the cutting apparatus 4 and the suction adhesion parts 114c of the leg members 114 are pressed against the upper surface of the ceiling 92a of the cover 92 as illustrated in FIG. 7. This can cause the suction adhesion parts 114c to adhere to the upper surface of the ceiling 92a of the cover 92 by suction and mount the arbitrary passage module 6a, 6b, or 6c to the cover 92. That is, the arbitrary passage module 6a, 6b, or 6c is mounted to the cover 92 of the cutting apparatus 4 with the intermediary of the leg members 114.

All the passage modules 6a, 6b, and 6c do not necessarily have to be mounted to the cutting apparatus 4. For example, the passage module located between two cutting apparatuses 4 is often supported by only the passage module adjacent with the intermediary of the coupling piece 110. Furthermore, as illustrated in FIG. 1, an information providing part 102b such as an identification code typified by a two-dimensional code or a wireless tag is set on the passage part 102 of the passage module mounted to the cutting apparatus 4, the stock unit 8, or the like. The information provided by the information providing part 102b is used for a check of the position of the automated workpiece conveying vehicle 10 and so forth, for example.

Figure 12A:
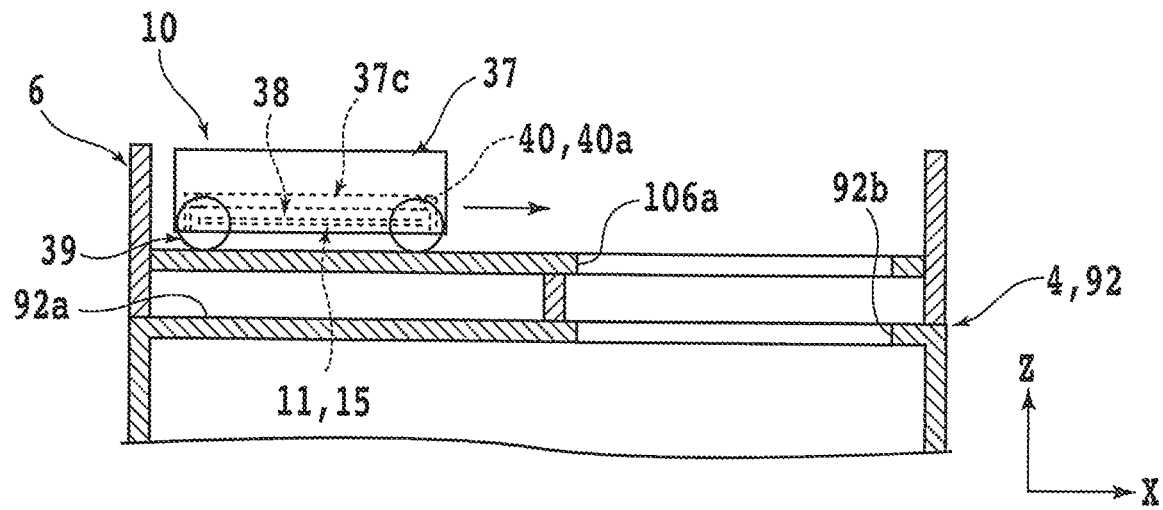
FIG. 12A is a side elevational view, partly in cross section, illustrating the manner in which the automated workpiece conveying vehicle is to be moved to a position directly above an opening, as viewed from a Y-axis direction.

Next, operation of the workpiece storage member 38 of the automated workpiece conveying vehicle 10 as it is conveyed between a first vehicle stop region of the conveyance passage 6 above the cutting apparatus 4 and the workpiece storage member holding base 50 of the cutting apparatus 4 will be described in detail below. FIG. 12A is a side elevational view, partly in cross section, illustrating the manner in which the automated workpiece conveying vehicle 10 is to be moved to a position directly above the opening 106a, as viewed from a Y-axis direction, and FIG. 12B is a side elevational view, partly in cross section, illustrating the manner in which the workpiece storage member 38 is lowered, as viewed from the Y-axis direction.

Figure 12B:
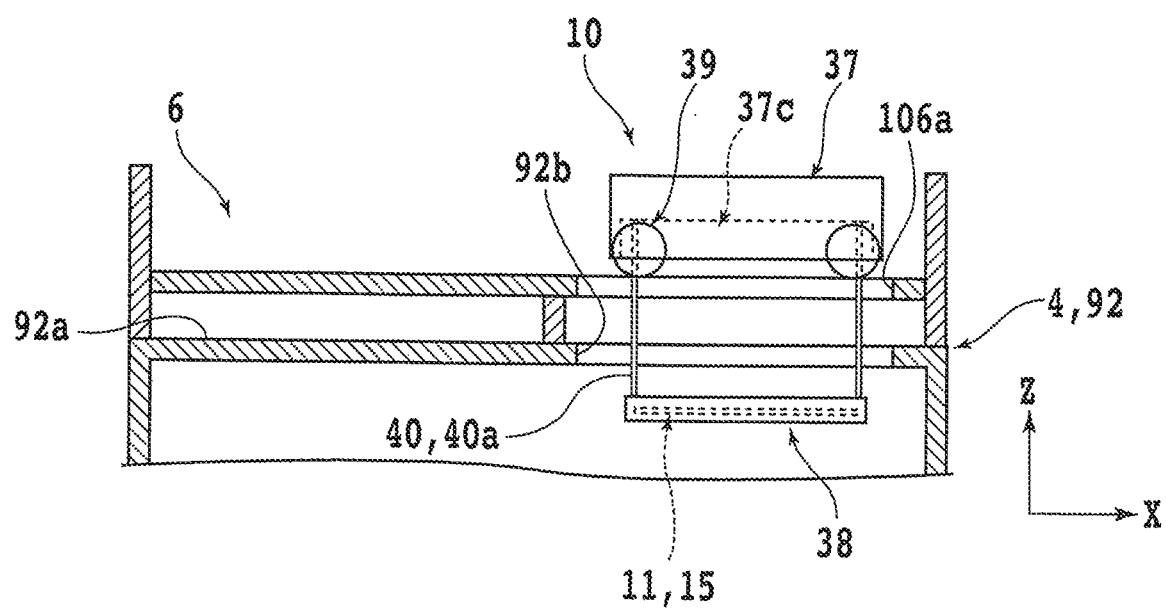
FIG. 12B is a side elevational view, partly in cross section, illustrating the manner in which the workpiece storage member is lowered, as viewed from the Y-axis direction.
Figure 13A:
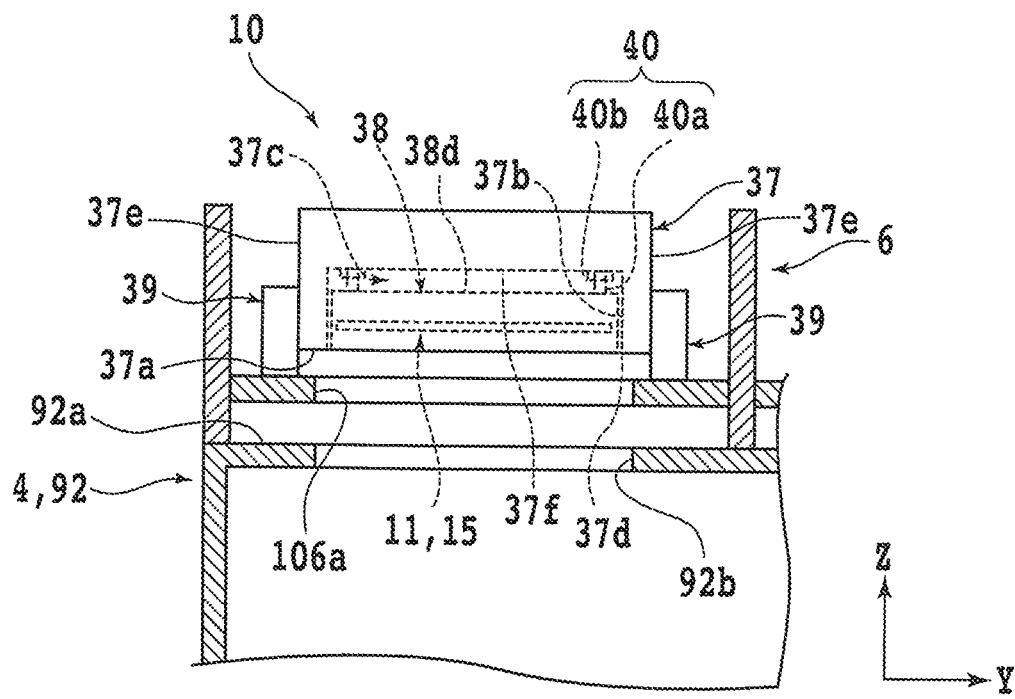
FIG. 13A is a side elevational view, partly in cross section, illustrating the state of FIG. 12A as viewed from an X-axis direction.
Figure 13B:
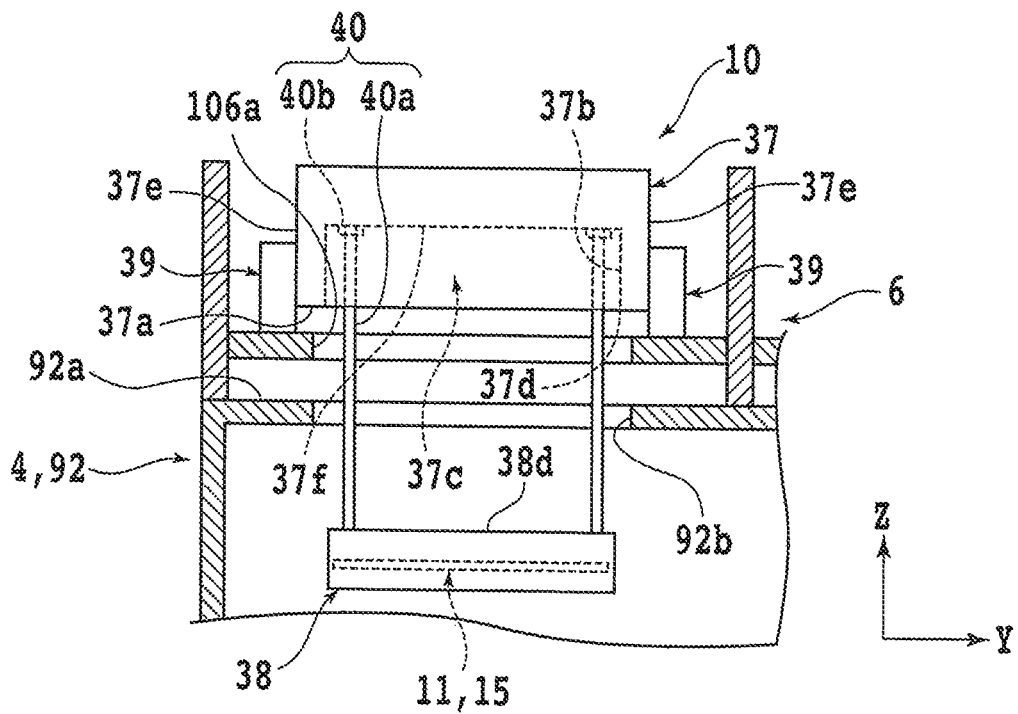
FIG. 13B is a side elevational view, partly in cross section, illustrating the state of FIG. 12B as viewed from the X-axis direction.

FIG. 13A is a side elevational view, partly in cross section, illustrating the state of FIG. 12A as viewed from an X-axis direction, and FIG. 13B is a side elevational view, partly in cross section, illustrating the state of FIG. 12B as viewed from the X-axis direction. For conveying the workpiece storage member 38 from the first vehicle stop region of the conveyance passage 6 above the cutting apparatus 4 to the workpiece storage member holding base 50 of the cutting apparatus 4, the automated workpiece conveying vehicle 10 is initially positioned laterally of the opening 106a, as illustrated in FIGS. 12A and 13A.

Then, the wheels 39 are rotated to move the automated workpiece conveying vehicle 10 to a position above the opening 106a. Specifically, the orientations of the rotational shafts of the four wheels 39 are made perpendicularly to the direction in which the automated workpiece conveying vehicle 10 is moved, i.e., the X-axis direction in the present embodiment, after which the automated workpiece conveying vehicle 10 is moved so as to straddle the opening 106a with the wheels 39 until the cavity 37b, i.e., the space 37c, is positioned directly above the opening 106a.

As illustrated in FIGS. 12B and 13B, while the automated workpiece conveying vehicle 10 is stopping in a first vehicle stop position where the cavity 37b is positioned directly above the opening 106a, the winches 40b of the lifting and lowering mechanisms 40 are operated to draw out the wires 40a. The workpiece storage member 38 is now lowered through the opening 106a and the opening 92b until the workpiece storage member 38 is placed on the workpiece storage member holding base 50.

After the workpiece storage member 38 has been placed on the workpiece storage member holding base 50, the workpiece 11 (the frame 15) is unloaded from the workpiece storage member 38. After the cutting of the workpiece 11 has been completed, the workpiece 11 (the frame 15) is loaded into the workpiece storage member 38.

For conveying the workpiece storage member 38 from the workpiece storage member holding base 50 of the cutting apparatus 4 to the first vehicle stop region of the conveyance passage 6 above the cutting apparatus 4, the winches 40b of the lifting and lowering mechanisms 40 are first operated to wind the wires 40a. The workpiece storage member 38 is now lifted through the openings 92b and 106a unloaded out of the cover 92 of the cutting apparatus 4, whereupon the workpiece storage member 38 is housed into the space 37c in the cavity 37b.

After the workpiece storage member 38 has been housed in the space 37c in the cavity 37b, the wheels 39 are rotated to move the automated workpiece conveying vehicle 10 from the first vehicle stop region. The operation of the workpiece storage member 38 as it is conveyed between the first vehicle stop region of the conveyance passage 6 above the cutting apparatus 4 and the workpiece storage member holding base 50 of the cutting apparatus 4 has been described above. When the workpiece storage member 38 is conveyed between a second vehicle stop region of the conveyance passage 6 above the stock unit 8 and the workpiece storage member holding base 26 of the stock unit 8, the workpiece storage member 38 operates in a similar fashion.

Figure 14:
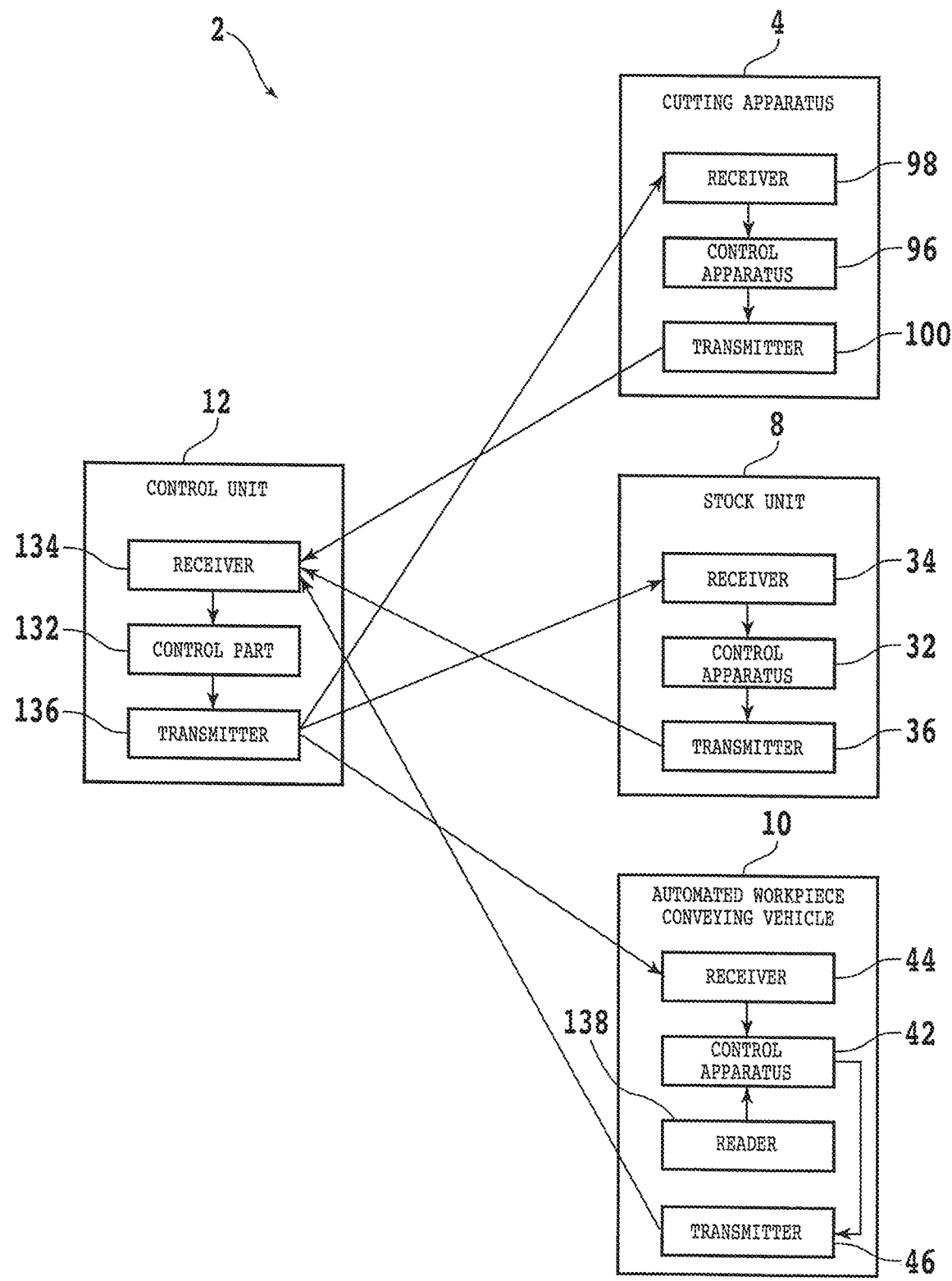
FIG. 14 is a functional block diagram for explaining an example of a control method of the conveyance system according to Embodiment 1.

Next, an example of a control method of the conveyance system 2 according to the present embodiment will be described. FIG. 14 is a functional block diagram for explaining the example of the control method of the conveyance system 2. For example, when the situation in which the new workpiece 11 (unprocessed workpiece 11) is necessary occurs, the control apparatus 96 of the cutting apparatus 4 generates a notification signal (workpiece request signal) for notifying this. The notification signal (workpiece request signal) generated by the control apparatus 96 is transmitted from the transmitter 100 to the control unit 12.

As illustrated in FIG. 14, the control unit 12 includes a control part (control signal generating part) 132 that generates a control signal for executing various kinds of control. Typically, the control part 132 is formed of a computer including a processing apparatus such as a CPU and a storing apparatus such as a flash memory, and functions of the control part 132 are implemented by causing the processing apparatus and so forth to operate in accordance with software stored in the storing apparatus.

To this control part 132, a receiver 134 that receives notification signals transmitted from the cutting apparatus 4, the stock unit 8, the automated workpiece conveying vehicle 10, and so forth and a transmitter 136 that transmits control signals to the cutting apparatus 4, the stock unit 8, the automated workpiece conveying vehicle 10, and so forth are connected.

When receiving the notification signal (workpiece request signal) transmitted from the transmitter 100 of the cutting apparatus 4, the receiver 134 of the control unit 12 sends it to the control part 132. When checking the notification signal (workpiece request signal) from the cutting apparatus 4, the control part 132 issues, to the automated workpiece conveying vehicle 10, an instruction to move to a position near the stock unit 8 and convey the workpiece storage member 38 to the workpiece storage member holding base 26 of the stock unit 8. Specifically, the control part 132 generates a control signal (first conveyance instruction signal) equivalent to this instruction and transmits it from the transmitter 136 to the automated workpiece conveying vehicle 10.

When receiving the control signal (first conveyance instruction signal) from the control unit 12, the receiver 44 of the automated workpiece conveying vehicle 10 sends it to the control apparatus 42. The control apparatus 42 controls operation of the wheels (traveling mechanism) 39 and so forth based on this control signal (first conveyance instruction signal) and causes the automated workpiece conveying vehicle 10 to travel along the conveyance passage 6.

As illustrated in FIG. 14, a reader 138 for reading information of the information providing part 102b set on the conveyance passage 6 is connected to the control apparatus 42 of the automated workpiece conveying vehicle 10. Thus, the control apparatus 42 can check its position (a position of the automated workpiece conveying vehicle 10) by reading the information of the information providing part 102b by the reader 138.

When the control apparatus 42 confirms that it, i.e., the automated workpiece conveying vehicle 10, has moved to a position near the stock unit 8, the control apparatus 42 controls again operation of the wheels 39, etc. to move the automated workpiece conveying vehicle 10 to the second vehicle stop region where the automated workpiece conveying vehicle 10 with the wheels 39 straddles the opening 106a overlapping the opening 16b. As a result, the space 37c that houses the workpiece storage member 38 therein is positioned directly above the opening 106a.

With the automated workpiece conveying vehicle 10 stopping in the second vehicle stop region, the control apparatus 42 operates the winches 40b of the lifting and lowering mechanisms 40 to draw out the wires 40a. The workpiece storage member 38 is now lowered through the opening 106a and the opening 16b until the workpiece storage member 38 is placed on the workpiece storage member holding base 26.

After having placed the workpiece storage member 38 on the workpiece storage member holding base 26, the control apparatus 42 generates a notification signal, i.e., a first conveyance completion signal, for indicating that the conveyance of the workpiece storage member 38 to the stock unit 8 is completed. The notification signal (first conveyance completion signal) generated by the control apparatus 42 is transmitted from the transmitter 46 to the control unit 12.

When the receiver 134 of the control unit 12 receives the notification signal (first conveyance completion signal) transmitted from the transmitter 46 of the automated workpiece conveying vehicle 10, the receiver 134 sends the received notification signal to the control part 132. When the control part 132 confirms the notification signal (first conveyance completion signal) from the automated workpiece conveying vehicle 10, the control part 132 issues an instruction to the stock unit 8 to load a new workpiece 11 into the workpiece storage member 38 on the workpiece storage member holding base 26. Specifically, the control part 132 generates a control signal (first loading instruction signal) representing the instruction, and transmits the control signal from the transmitter 136 to the stock unit 8.

When the receiver 34 of the stock unit 8 receives the control signal (first loading instruction signal) from the control unit 12, the receiver 34 sends the received control signal to the control apparatus 32. Based on the control signal (first loading instruction signal), the control apparatus 32 controls operation of the first raising-lowering mechanism, the push-pull arm 22, the pair of guide rails 24, the second raising-lowering mechanism, etc. to load a new workpiece 11 into the workpiece storage member 38.

When the new workpiece 11 is loaded into the workpiece storage member 38, the control apparatus 32 generates a notification signal (first loading completion signal) for notifying that the loading of the new workpiece 11 into the workpiece storage member 38 is completed. The notification signal (first loading completion signal) generated by the control apparatus 32 is transmitted from the transmitter 36 to the control unit 12.

When the receiver 134 of the control unit 12 receives the notification signal (first loading completion signal) transmitted from the transmitter 36 of the stock unit 8, the receiver 134 sends the received notification signal to the control part 132. When the control part 132 confirms the notification signal (first loading completion signal) from the stock unit 8, the control part 132 issues an instruction to the automated workpiece conveying vehicle 10 to move to a position near the cutting apparatus 4 and convey the chassis 37 to the workpiece storage member holding base 50 of the cutting apparatus 4. Specifically, the control part 132 generates a control signal (second conveyance instruction signal) representing the instruction and transmits the control signal from the transmitter 136 to the automated workpiece conveying vehicle 10.

When the receiver 44 of the automated workpiece conveying vehicle 10 receives the control signal (second conveyance instruction signal) from the control unit 12, the receiver 44 sends the received control signal to the control apparatus 42. Based on the control signal, i.e., the second conveyance instruction signal, the control apparatus 42 lifts the workpiece storage member 38 to store it into the space 37c in the chassis 37. Thereafter, the control apparatus 42 controls operation of the wheels 39, etc. to propel the automated workpiece conveying vehicle 10 along the conveyance passage 6.

When the control apparatus 42 confirms that it, i.e., the automated workpiece conveying vehicle 10, has moved to a position near the cutting apparatus 4, the control apparatus 42 controls again operation of the wheels 39, etc. to move the automated workpiece conveying vehicle 10 to the first vehicle stop region where the automated workpiece conveying vehicle 10 with the wheels 39 straddles the opening 106a overlapping the opening 92b. As a result, the space 37c that houses the workpiece storage member 38 therein is positioned directly above the opening 106a.

With the automated workpiece conveying vehicle 10 stopping in the first vehicle stop region, the control apparatus 42 operates the winches 40b of the lifting and lowering mechanisms 40 to draw out the wires 40a. The workpiece storage member 38 is now lowered through the opening 106a and the opening 92b until the workpiece storage member 38 is placed on the workpiece storage member holding base 50.

After having placed the workpiece storage member 38 on the workpiece storage member holding base 50, the control apparatus 42 generates a notification signal, i.e., a second conveyance completion signal, for indicating that the conveyance of the workpiece storage member 38 to the cutting apparatus 4 is completed. The notification signal (second loading completion signal) generated by the control apparatus 42 is transmitted from the transmitter 46 to the control unit 12.

When the receiver 134 of the control unit 12 receives the notification signal (second loading completion signal) transmitted from the transmitter 46 of the automated workpiece conveying vehicle 10, the receiver 134 sends the received notification signal to the control part 132. When the control part 132 confirms the notification signal (second loading completion signal) from the automated workpiece conveying vehicle 10, the control part 132 issues an instruction to the cutting apparatus 4 to unload the new workpiece 11 out of the workpiece storage member 38 on the workpiece storage member holding base 50. Specifically, the control part 132 generates a control signal (first unloading instruction signal) representing the instruction and transmits the control signal from the transmitter 136 to the cutting apparatus 4.

When the receiver 98 of the cutting apparatus 4 receives the control signal (first unloading instruction signal) from the control unit 12, the receiver 98 sends the received control signal to the control apparatus 96. The control apparatus 96 controls operation of the constituent elements on the basis of the control signal (first unloading instruction signal) to unload the new workpiece 11 out of the workpiece storage member 38.

When the new workpiece 11 is unloaded from the workpiece storage member 38, the control apparatus 96, for example, generates a notification signal (first unloading completion signal) for notifying that the unloading of the workpiece 11 out of the workpiece storage member 38 is completed. The notification signal (first unloading completion signal) generated by the control apparatus 96 is transmitted from the transmitter 100 to the control unit 12.

According to the procedure described above, a workpiece 11 stored in the stock unit 8 can be conveyed to any cutting apparatus 4. The procedure for conveying the workpiece 11 from the stock unit 8 to a cutting apparatus 4 has mainly been described above. However, a procedure for conveying the workpiece 11 from the cutting apparatus 4 to the stock unit 8 is also similarly carried out.

Specifically, for example, when the processing of a workpiece 11 is completed, the control apparatus 96 of the cutting apparatus 4 generates a notification signal (processing completion signal) for notifying the completion of the processing. The notification signal (processing completion signal) generated by the control apparatus 96 is transmitted from the transmitter 100 to the control unit 12. When the receiver 134 of the control unit 12 receives the notification signal (processing completion signal) transmitted from the transmitter 100, the receiver 134 sends the received notification signal to the control part 132.

When the control part 132 confirms the notification signal (processing completion signal) from the cutting apparatus 4, the control part 132 issues an instruction to the automated workpiece conveying vehicle 10 to move to a position near the cutting apparatus 4 and convey the workpiece storage member 38 to the workpiece storage member holding base 50 of the cutting apparatus 4. Specifically, the control part 132 generates a control signal (third conveyance instruction signal) representing the instruction and transmits the generated control signal from the transmitter 136 to the automated workpiece conveying vehicle 10.

When the receiver 44 of the automated workpiece conveying vehicle 10 receives the control signal (third conveyance instruction signal) from the control unit 12, the receiver 44 sends the received control signal to the control apparatus 42. Based on the control signal (third conveyance instruction signal), the control apparatus 42 controls operation of the wheels (traveling mechanisms) 39, etc. to propel the automated workpiece conveying vehicle 10 along the conveyance passage 6.

When the control apparatus 42 confirms that it, i.e., the automated workpiece conveying vehicle 10, has moved to a position near the cutting apparatus 4, the control apparatus 42 controls again operation of the wheels 39, etc. to move the automated workpiece conveying vehicle 10 to the first vehicle stop region where the automated workpiece conveying vehicle 10 with the wheels 39 straddles the opening 106a overlapping the opening 92b. As a result, the space 37c that houses the workpiece storage member 38 therein is positioned directly above the opening 106a.

With the automated workpiece conveying vehicle 10 stopping in the first vehicle stop region, the control apparatus 42 operates the winches 40b of the lifting and lowering mechanisms 40 to draw out the wires 40a. The workpiece storage member 38 is now lowered through the opening 106a and the opening 92b until the workpiece storage member 38 is placed on the workpiece storage member holding base 50.

After having placed the workpiece storage member 38 on the workpiece storage member holding base 50, the control apparatus 42 generates a notification signal, i.e., a third conveyance completion signal, for indicating that the conveyance of the workpiece storage member 38 to the cutting apparatus 4 is completed. The notification signal (the third conveyance completion signal) generated by the control apparatus 42 is transmitted from the transmitter 46 to the control unit 12.

When the receiver 134 of the control unit 12 receives the notification signal (third conveyance completion signal) transmitted from the transmitter 46 of the automated workpiece conveying vehicle 10, the receiver 134 sends the received notification signal to the control part 132. When the control part 132 confirms the notification signal (third conconveying vehicle 10, the control part 132 issues an instruction to the cutting apparatus 4 to load the processed workpiece 11 into the workpiece storage member 38 on the workpiece storage member holding base 50. Specifically, the control part 132 generates a control signal (second loading instruction signal) representing the instruction and transmits the control signal from the transmitter 136 to the cutting apparatus 4.

When the receiver 98 of the cutting apparatus 4 receives the control signal (second loading instruction signal) from the control unit 12, the receiver 98 sends the received control signal to the control apparatus 96. Based on the control signal (second loading instruction signal), the control apparatus 96 controls operation of the constituent elements to load the processed workpiece 11 into the workpiece storage member 38.

When the processed workpiece 11 is loaded into the workpiece storage member 38, the control apparatus 96 generates a notification signal (second loading completion signal) for notifying that the loading of the workpiece 11 into the workpiece storage member 38 is completed. The notification signal (second loading completion signal) generated by the control apparatus 96 is transmitted from the transmitter 100 to the control unit 12.

When the receiver 134 of the control unit 12 receives the notification signal (second loading completion signal) transmitted from the transmitter 100 of the cutting apparatus 4, the receiver 134 sends the received notification signal to the control part 132. When the control part 132 confirms the notification signal (second loading completion signal) from the cutting apparatus 4, the control part 132 issues an instruction to the automated workpiece conveying vehicle 10 to move the workpiece storage member 38 to a position near the stock unit 8 and convey the chassis 37 to the workpiece storage member holding base 26 of the stock unit 8. Specifically, the control part 132 generates a control signal (fourth conveyance instruction signal) representing the instruction and transmits the control signal from the transmitter 136 to the automated workpiece conveying vehicle 10.

When the receiver 44 of the automated workpiece conveying vehicle 10 receives the control signal (fourth conveyance instruction signal) from the control unit 12, the receiver 44 sends the received control signal to the control apparatus 42. Based on the control signal, i.e., the fourth conveyance instruction signal, the control apparatus 42 lifts the workpiece storage member 38 to store it into the space 37c in the chassis 37. Thereafter, the control apparatus 42 controls operation of the wheels 39, etc. to propel the automated workpiece conveying vehicle 10 along the conveyance passage 6.

When the control apparatus 42 confirms that it, i.e., the automated workpiece conveying vehicle 10, has moved to a position near the stock unit 8, the control apparatus 42 controls again operation of the wheels 39, etc. to move the automated workpiece conveying vehicle 10 to the second vehicle stop region where the automated workpiece conveying vehicle 10 with the wheels 39 straddles the opening 106a overlapping the opening 16b. As a result, the space 37c that houses the workpiece storage member 38 therein is positioned directly above the opening 106a.

With the automated workpiece conveying vehicle 10 stopping in the second vehicle stop region, the control apparatus 42 operates the winches 40b of the lifting and lowering mechanisms 40 to draw out the wires 40a. The workpiece storage member 38 is now lowered through the opening 106a and the opening 16b until the workpiece storage member 38 is placed on the workpiece storage member holding base 26.

After having placed the workpiece storage member 38 on the workpiece storage member holding base 26, the control apparatus 42 generates a notification signal, i.e., a fourth conveyance completion signal, for indicating that the conveyance of the workpiece storage member 38 to the stock unit 8 is completed. The notification signal (fourth conveyance completion signal) generated by the control apparatus 42 is transmitted from the transmitter 46 to the control unit 12.

When the receiver 134 of the control unit 12 receives the notification signal (fourth conveyance completion signal) transmitted from the transmitter 46 of the automated workpiece conveying vehicle 10, the receiver 134 sends the received notification signal to the control part 132. When the control part 132 confirms the notification signal (fourth conveyance completion signal) from the automated workpiece conveying vehicle 10, the control part 132 issues an instruction to the stock unit 8 to unload the processed workpiece 11 out of the workpiece storage member 38 on the workpiece storage member holding base 26. Specifically, the control part 132 generates a control signal (second unloading instruction signal) representing the instruction and transmits the control signal from the transmitter 136 to the stock unit 8.

When the receiver 34 of the stock unit 8 receives the control signal (second unloading instruction signal) from the control unit 12, the receiver 34 sends the received control signal to the control apparatus 32. Based on the control signal (second unloading instruction signal), the control apparatus 32 controls operation of the first raising-lowering mechanism, the push-pull arm 22, the pair of guide rails 24, the second raising-lowering mechanism, etc. to unload the processed workpiece 11 out of the workpiece storage member 38.

When the processed workpiece 11 is unloaded from the workpiece storage member 38, the control apparatus 32, for example, generates a notification signal (second unloading completion signal) for notifying that the unloading of the workpiece 11 out of the workpiece storage member 38 is completed. The notification signal (second unloading completion signal) generated by the control apparatus 32 is transmitted from the transmitter 36 to the control unit 12. According to the procedure described above, the workpiece 11 processed by the cutting apparatus 4 can be conveyed to the stock unit 8.

The procedure described above can be changed arbitrarily within a range in which the workpiece 11 can be conveyed appropriately. For example, a plurality of steps included in the above procedure may be carried out simultaneously, or the order of steps may be switched around within a range in which the steps thus switched around pose no difficulty in conveying the workpiece 11. Similarly, arbitrary steps may be added, changed, or omitted within a range in which the steps thus added, changed, or omitted pose no difficulty in conveying the workpiece 11.

As described above, the conveyance system 2 according to the present embodiment includes the conveyance passage 6 disposed over the plurality of cutting apparatuses, i.e., processing apparatus, 4, the automated workpiece conveying vehicle 10 for traveling on the conveyance passage 6, the automated workpiece conveying vehicle 10 having the workpiece storage member 38 having the space, i.e., housing space, 38a for housing the workpiece 11 therein, the chassis, i.e., the traveling member, 37 having the space, i.e., the storage space, 37c for storing the workpiece storage member 38, the wheels, or the traveling mechanisms, 39 mounted on the chassis 37, the lifting and lowering mechanisms 40 disposed in the space 37c in the chassis 37 for lifting and lowering the workpiece storage member 38 while suspending the workpiece storage member 38 from above, and the receiver 44 for receiving control signals, the workpiece storage member holding base 26 for holding the workpiece storage member 38 when the workpiece 11 is transferred from the cassette, i.e., the workpiece stocker, 20 housing the workpiece 11 therein to the workpiece storage member 38 of the automated workpiece conveying vehicle 10, and the stock unit 8 having the receiver 34 for receiving control signals.

Consequently, the automated workpiece conveying vehicle 10 with the workpiece storage member 38 stored in the space 37c can travel on the conveyance passage 6. Furthermore, the automated workpiece conveying vehicle 10 can stop in the first vehicle stop region of the conveyance passage 6 above the cutting apparatus, i.e., the processing apparatus, 4 or the second vehicle stop region of the conveyance passage 6 above the stock unit 8, and lift and lower the workpiece storage member 38, for conveying the workpiece storage member 38 between the first vehicle stop region and the workpiece storage member holding base 50 in the cutting apparatus 4 or between the second vehicle stop region and the workpiece storage member holding base 26 in the stock unit 8.

In the conveyance system 2 according to the present embodiment, the conveyance passage 6 is disposed in a space directly above the cutting apparatus 4. Consequently, it is not necessary to take into account the structure of side surfaces of each cutting apparatus 4 in designing the conveyance passage 6. In other words, the conveyance system can be constructed with ease.

Consequently, the automated workpiece conveying vehicle 10 with the workpiece storage member 38 stored in the space 37c can travel on the conveyance passage 6. Furthermore, the automated workpiece conveying vehicle 10 can stop in the first vehicle stop region of the conveyance passage 6 above the cutting apparatus, i.e., the processing apparatus, 4 or the second vehicle stop region of the conveyance passage 6 above the stock unit 8, and lift and lower the vehicle storage member 8, for conveying the workpiece storage member 38 between the first vehicle stop region and the workpiece storage member holding base 50 in the cutting apparatus 4 or between the second vehicle stop region and the workpiece storage member holding base 26 in the stock unit 8.

Embodiment 2

According to the present embodiment, an automated workpiece conveying vehicle, i.e., an automated conveying vehicle, having a structure different from the automated workpiece conveying vehicle, i.e., the automated conveying vehicle, 10 according to Embodiment 1 will be described below. The automated workpiece conveying vehicle according to the present embodiment has a basic structure that is the same as the basic structure of the automated workpiece conveying vehicle 10 according to Embodiment 1. Therefore, common structural details are denoted by identical reference characters, and their detailed description will be omitted below. Similarly, components that are shared by the conveyance system 2, etc. according to Embodiment 1 are also denoted by identical reference characters, and their detailed description will be omitted below.

Figure 15:
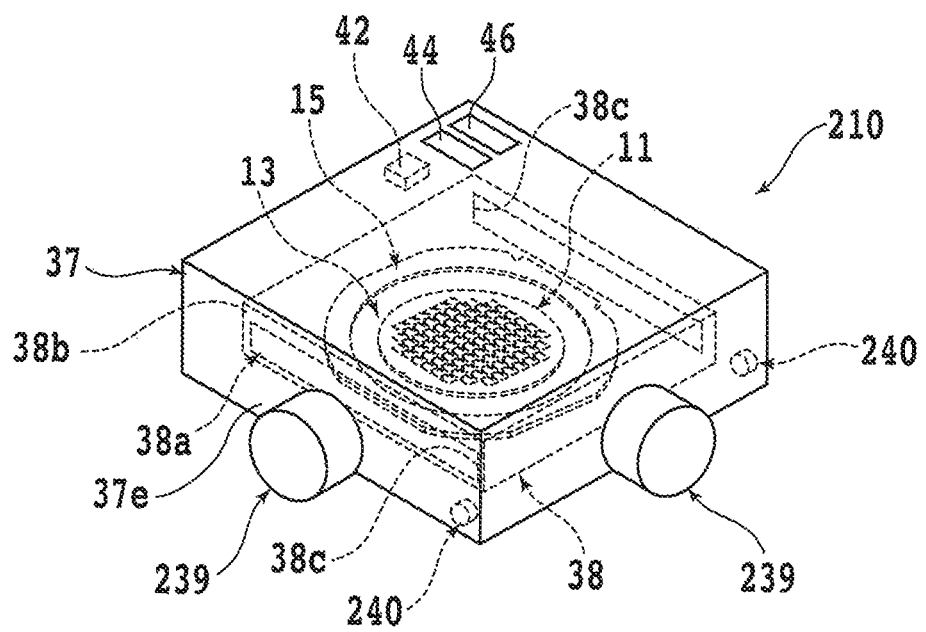
FIG. 15 is a perspective view schematically illustrating a configurational example of an automated workpiece conveying vehicle according to Embodiment 2.

FIG. 15 is a perspective view illustrating a configurational example of an automated workpiece conveying vehicle, i.e., an automated conveying vehicle, 210 according to the present embodiment. As illustrated in FIG. 15, the automated conveying vehicle 210 includes a chassis, i.e., a traveling member, 37 shaped as a rectangular parallelepiped and having four side surfaces 37e on which there are disposed wheels, i.e., traveling mechanisms, 239 having rotational shafts generally perpendicular to the side surface 37e. In other words, the automated workpiece conveying vehicle 210 has a total of four wheels 239.

The wheels 239 are coupled to a rotational drive source such as an electric motor, and are rotatable thereby. When the wheels 239 are rotated by the rotational drive source, the automated workpiece conveying vehicle 210, i.e., the chassis 37, travels on the conveyance passage 6. The wheels 239 may be what is called mecanum wheels or the like each having a plurality of inclined barrel-shaped or tubular rotors mounted on an outer circumferential surface for contact with the conveyance passage 6. The mecanum wheels used as the wheels 239 allow the automated workpiece conveying vehicle 210 to move in any arbitrary directions simply by adjusting the rates at which the wheels 239 rotate.

Two sub-wheels 240 having rotational shafts generally parallel to the rotational shafts of any two of the wheels 239 are disposed on the lower surface 37a of the chassis 37. The two sub-wheels 240 are spaced from each other by an interval larger than the width of the opening 37d of the cavity 37b. The two sub-wheels 240 have a diameter small enough to stay out of contact with the passage part 102, etc. of the conveyance passage 6 when the automated workpiece conveying vehicle 210 travels on the passage part 102, etc. by the wheels 239.

The sub-wheels 240 are not coupled to a rotational drive source such as an electric motor, and are freely rotatable. However, the sub-wheels 240 may be coupled to a rotational drive source. There is no special limitation on the number of the sub-wheels 240. The automated workpiece conveying vehicle 210 may have a single sub-wheel 240 having a rotational shaft generally parallel to the rotational shafts of any two of the wheels 239 or three or more sub-wheels 240 having similar rotational shafts.

Figure 16A:
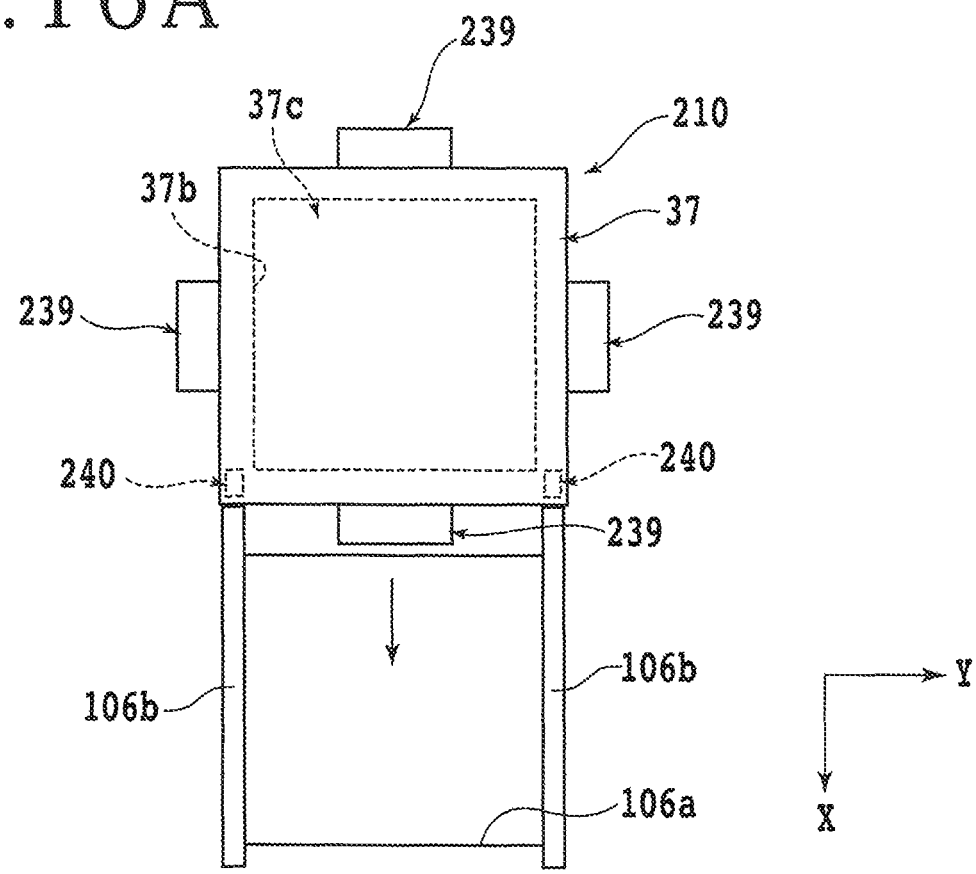
FIG. 16A is a plan view illustrating the manner in which the automated workpiece conveying vehicle is to be moved to a position directly above an opening, as viewed from a Z-axis direction.

Next, operation of the workpiece storage member 38 of the automated workpiece conveying vehicle 210 as it is conveyed between the first vehicle stop region of the conveyance passage 6 above the cutting apparatus 4 and the workpiece storage member holding base 50 of the cutting apparatus 4 will be described in detail below. FIG. 16A is a plan view illustrating the manner in which the automated workpiece conveying vehicle 210 is to be moved to a position directly above the opening 106a, as viewed from a Z-axis direction, and FIG. 16B is a plan view illustrating the manner in which the workpiece storage member 38 is lowered, as viewed from the Z-axis direction.

Figure 16B:
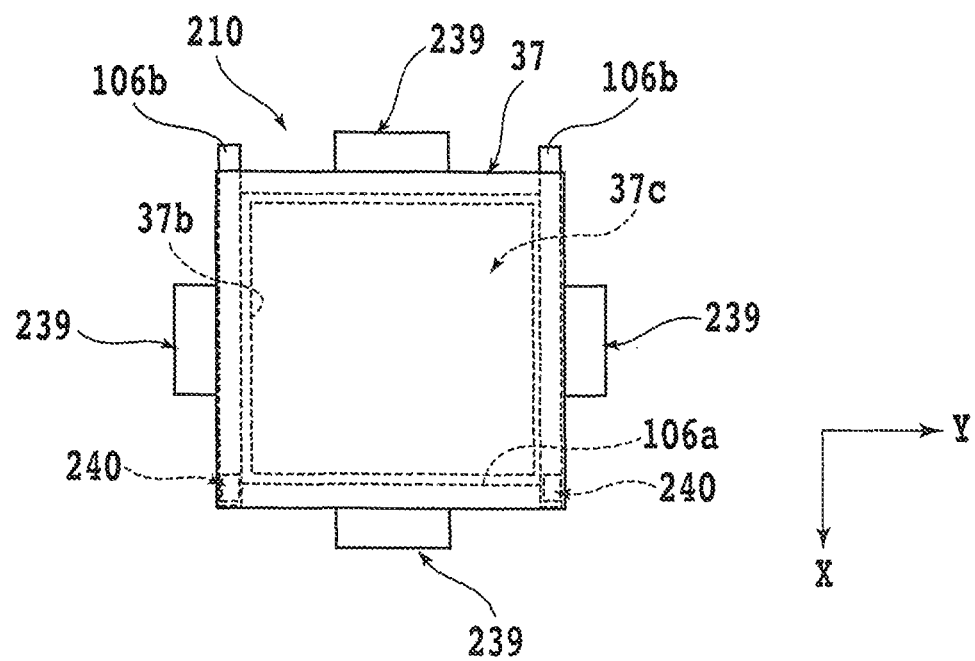
FIG. 16B is a plan view illustrating the manner in which the workpiece storage member is lowered, as viewed from the Z-axis direction.
Figure 17A:
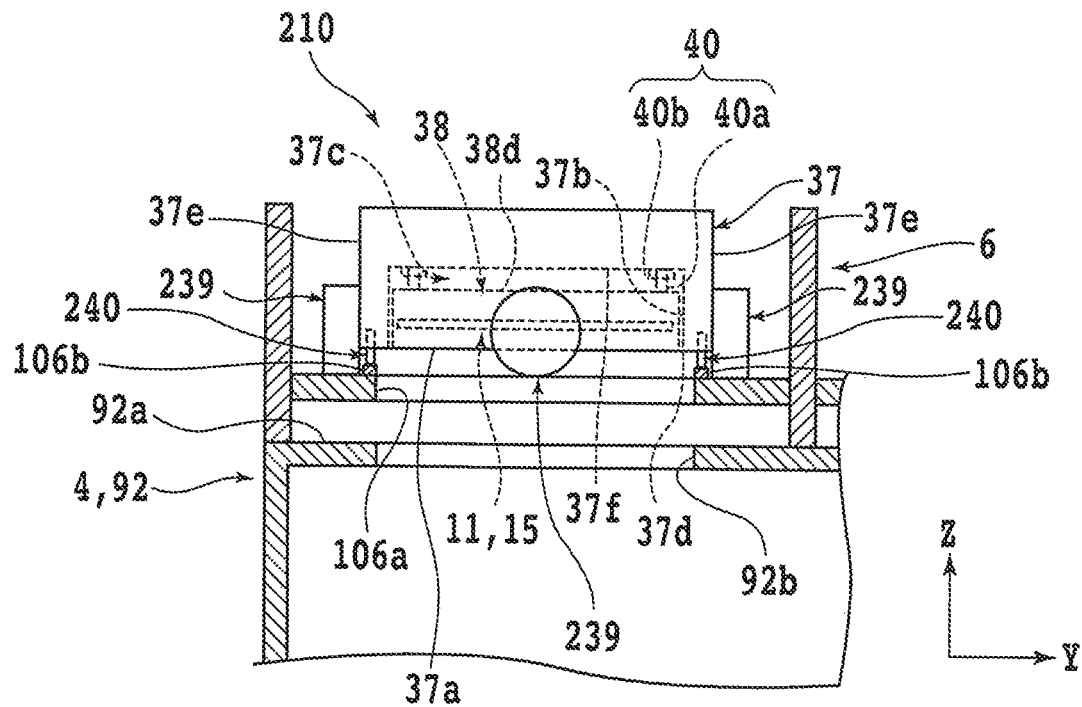
FIG. 17A is a side elevational view, partly in cross section, illustrating the state of FIG. 16A as viewed from an X-axis direction.
Figure 17B:
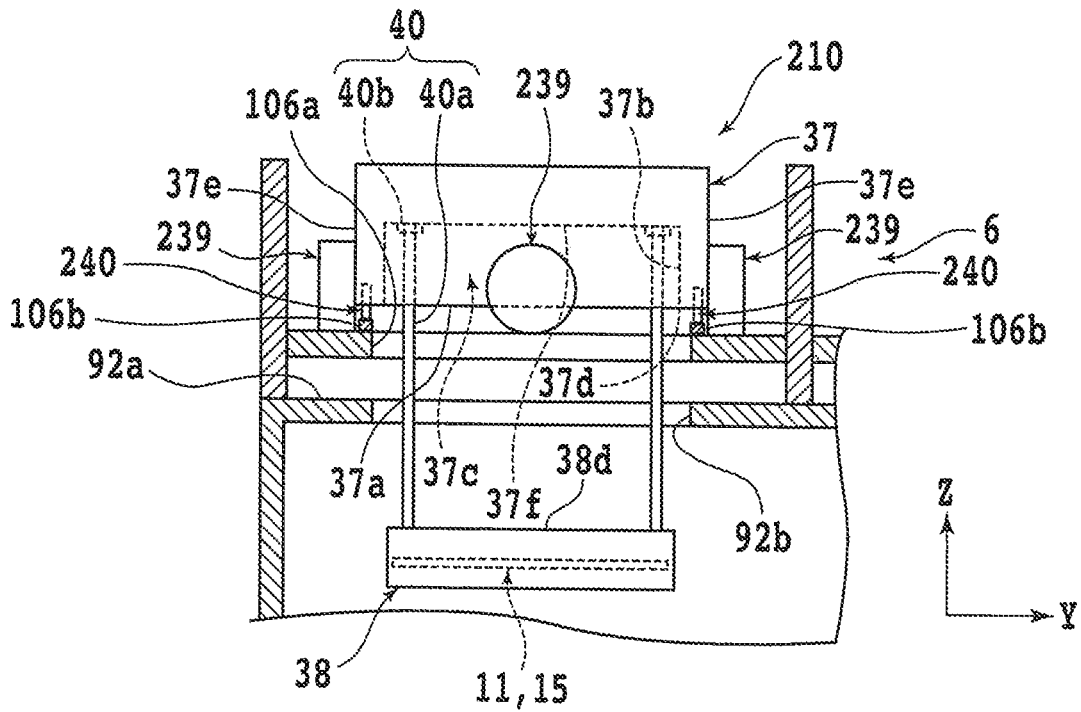
FIG. 17B is a side elevational view, partly in cross section, illustrating the state of FIG. 16B as viewed from the X-axis direction.

FIG. 17A is a side elevational view, partly in cross section, illustrating the state of FIG. 16A as viewed from an X-axis direction, and FIG. 17B is a side elevational view, partly in cross section, illustrating the state of FIG. 16B as viewed from the X-axis direction. For conveying the workpiece storage member 38 from the first vehicle stop region of the conveyance passage 6 above the cutting apparatus 4 to the workpiece storage member holding base 50 of the cutting apparatus 4, the automated workpiece conveying vehicle 210 is initially positioned laterally of the opening 106a, as illustrated in FIGS. 16A and 17A.

Then, the wheels 239 are rotated to move the automated workpiece conveying vehicle 210 to a position above the opening 106a. Specifically, the orientations of the rotational shafts of any two of the wheels 239 and the orientations of the rotational shafts of the two sub-wheels 240 are made perpendicularly to the direction in which the automated workpiece conveying vehicle 210 is moved, i.e., the X-axis direction in the present embodiment, after which the automated workpiece conveying vehicle 210 is moved so as to straddle the opening 106a with the wheels 239 until the cavity 37b, i.e., the space 37c, is positioned directly above the opening 106a.

More specifically, the orientation of the automated workpiece conveying vehicle 210 is adjusted such that the two sub-wheels 240 are positioned beside the wheel 239 that will pass directly above the opening 106a, after which the automated workpiece conveying vehicle 210 is moved to a position directly above the opening 106a. In other words, the two sub-wheels 240 are disposed beside the wheel 239 that will pass directly above the opening 106a, i.e., on the leading side or front side of the automated workpiece conveying vehicle 210 when the automated workpiece conveying vehicle 210 is moved to the position directly above the opening 106a.

According to the present embodiment, as illustrated in FIGS. 16A, 16B, 17A, and 17B, two passages 106b for the sub-wheels 240 are disposed on edges of the opening 106a in the conveyance passage 6. The two passages 106b are disposed in areas where the two sub-wheels 240 pass. The passages 106b have respective upper surfaces high enough to contact the sub-wheels 240.

Therefore, when the automated workpiece conveying vehicle 210 is moved to the position directly above the opening 106a, even though the wheel 239 that is positioned on the leading side or front side of the automated workpiece conveying vehicle 210 passes directly above the opening 106a, the sub-wheels 240 and the passage 106b contact each other, so that a part of the chassis 37 is supported by the sub-wheels 240. Consequently, the chassis 37 is prevented from being tilted largely when the automated workpiece conveying vehicle 210 is moved to the position directly above the opening 106a.

As illustrated in FIGS. 16B and 17B, after the automated workpiece conveying vehicle 210 has stopped in the first vehicle stop position where the cavity 37b is positioned directly above the opening 106a, the winches 40b of the lifting and lowering mechanisms 40 are operated to draw out the wires 40a. The workpiece storage member 38 is now lowered through the opening 106a and the opening 92b until the workpiece storage member 38 is placed on the workpiece storage member holding base 50.

After the workpiece storage member 38 has been placed on the workpiece storage member holding base 50, the workpiece 11 (the frame 15) is unloaded from the workpiece storage member 38. After the cutting of the workpiece 11 has been completed, the workpiece 11 (the frame 15) is loaded into the workpiece storage member 38.

For conveying the workpiece storage member 38 from the workpiece storage member holding base 50 of the cutting apparatus 4 to the first vehicle stop region of the conveyance passage 6 above the cutting apparatus 4, the winches 40b of the lifting and lowering mechanisms 40 are initially operated to wind the wires 40a. The workpiece storage member 38 is now lifted through the openings 92b and 106a and unloaded out of the cover 92 of the cutting apparatus 4, whereupon the workpiece storage member 38 is stored into the space 37c in the cavity 37b.

After the workpiece storage member 38 has been stored in the space 37c in the cavity 37b, the wheels 239 are rotated to move the automated workpiece conveying vehicle 210 from the first vehicle stop region. The operation of the workpiece storage member 38 as it is conveyed between the first vehicle stop region of the conveyance passage 6 above the cutting apparatus 4 and the workpiece storage member holding base 50 of the cutting apparatus 4 has been described above. When the workpiece storage member 38 is conveyed between the second vehicle stop region of the conveyance passage 6 above the stock unit 8 and the workpiece storage member holding base 26 of the stock unit 8, the workpiece storage member 38 operates in a similar fashion.

Embodiment 3

In the present embodiment, a stock unit with a different structure from the stock unit 8 will be described. The basic configuration of a conveyance system and so forth into which the stock unit of the present embodiment is incorporated is the same as the conveyance system 2 and so forth according to Embodiment 1. Thus, a common constituent element is given the same numeral and detailed description is omitted.

Figure 18:
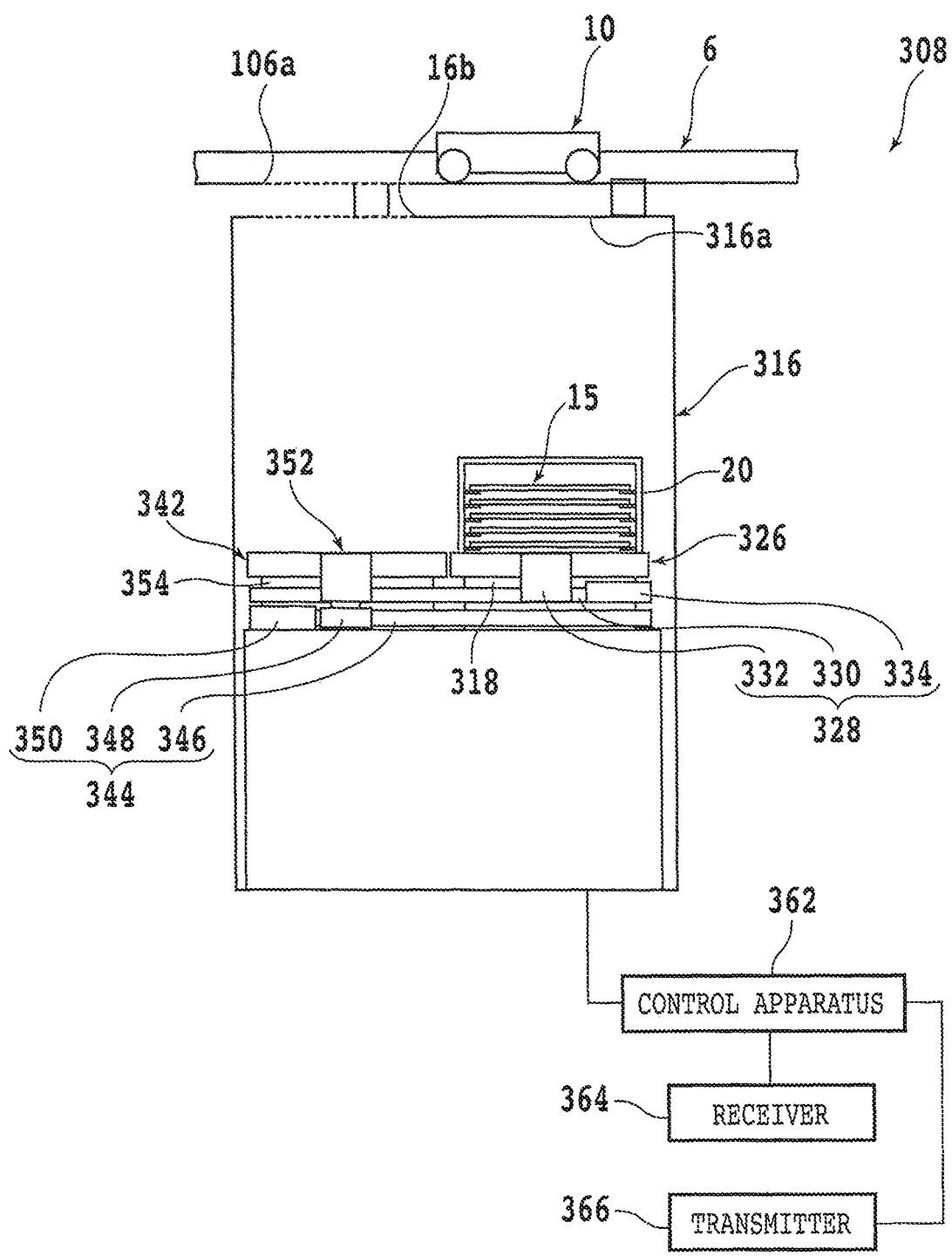
FIG. 18 is a side view schematically illustrating a configuration example of a stock unit according to Embodiment 3.
Figure 19:
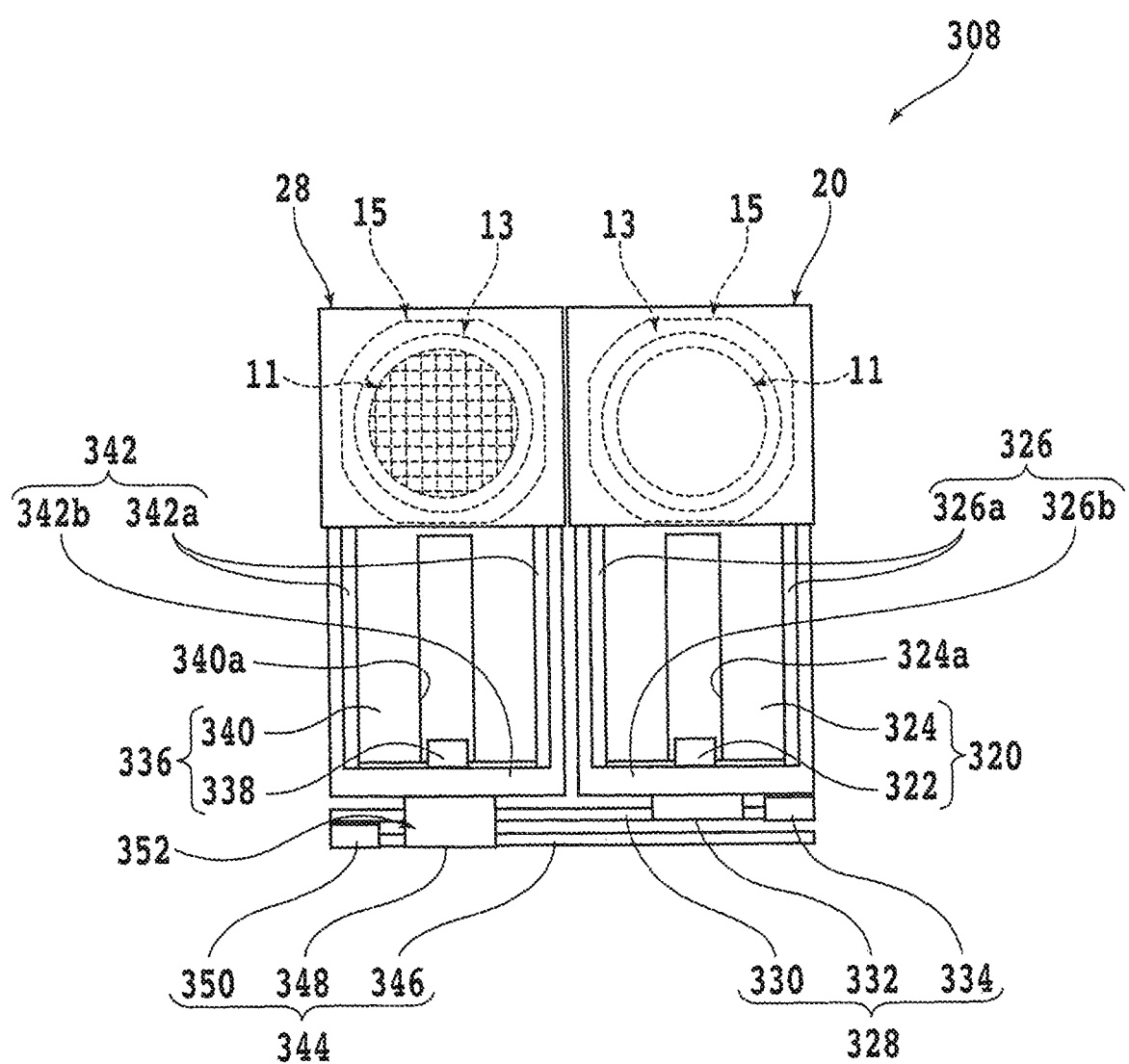
FIG. 19 is a plan view schematically illustrating the structure of the inside of the stock unit according to Embodiment 3.

FIG. 18 is a side view schematically illustrating a configuration example of a stock unit 308 according to the present embodiment, and FIG. 19 is a plan view schematically illustrating the structure of the inside of the stock unit 308. As illustrated in FIG. 18, the stock unit 308 includes a casing 316 that houses various constituent elements. In this FIG. 18, only the contour of the casing 316 is illustrated for convenience of description.

In the casing 316, a cassette holding base 318 that moves up and down by a first raising-lowering mechanism (not illustrated) of a ball screw type is disposed, for example. The cassette (workpiece stocker) 20 that can house plural workpieces 11 is placed on the upper surface of the cassette holding base 318. This cassette 20, for example, houses the workpieces 11 in the state of being supported by the frame 15 with the intermediary of the tape 13 as described above.

As illustrated in FIG. 19, a first workpiece movement unit 320 that grasps and moves the frame 15 is disposed at a first position that faces the cassette holding base 318 (cassette 20). The first workpiece movement unit 320 includes a grasping part 322 that vertically grasps the frame 15 and a drive part 324 that moves the grasping part 322 in a substantially horizontal direction.

A slit-shaped opening 324a that extends substantially horizontally toward the cassette holding base 318 is formed in the upper surface of the drive part 324, and the drive part 324 moves the grasping part 322 in a first direction along this opening 324a. That is, the grasping part 322 moves in such a manner as to get closer to the cassette holding base 318 or get further away from the cassette holding base 318.

Thus, for example, when the height of the frame 15 housed in the cassette 20 is adjusted to the height of the grasping part 322 by the first raising-lowering mechanism and the grasping part 322 is brought close to the cassette holding base 318, the frame 15 in the cassette 20 can be grasped by the grasping part 322. Furthermore, when the grasping part 322 is brought further away from the cassette holding base 318 after the frame 15 in the cassette 20 is grasped by the grasping part 322, the frame 15 can be drawn out to the outside of the cassette 20.

Around the first workpiece movement unit 320, a first temporary putting base 326 on which the frame 15 carried out from the cassette 20 is temporarily put is disposed. The first temporary putting base 326 includes a pair of guide parts 326a that are each long in the first direction and a base part 326b that is long in a second direction that is perpendicular to the first direction and is horizontal. The pair of guide parts 326a are coupled through the base part 326b in such a manner that the longitudinal directions thereof are parallel to each other. The frame 15 drawn out from the cassette 20 by the first workpiece movement unit 320 is placed on the pair of guide parts 326a.

The first temporary putting base 326 is supported by a first temporary putting base movement part 328 that moves this first temporary putting base 326 in the second direction. The first temporary putting base movement part 328 includes a guide rail 330 that is long in the second direction. A moving member 332 is slidably attached to the guide rail 330.

A nut part (not illustrated) is disposed on the moving member 332 and a ball screw (not illustrated) substantially parallel to the guide rail 330 is screwed to this nut part. A pulse motor 334 is coupled to one end of the ball screw. When the ball screw is rotated by the pulse motor 334, the moving member 332 moves in the second direction along the guide rail 330.

The base part 326b of the first temporary putting base 326 is fixed to the upper part of the moving member 332. Thus, the first temporary putting base 326 moves in the second direction together with the moving member 332. The first temporary putting base movement part 328 is configured to be capable of moving the first temporary putting base 326 between the first position and a second position adjacent to this first position.

A second workpiece movement unit 336 that grasps and moves the frame 15 is disposed at the second position. That is, the second workpiece movement unit 336 is disposed adjacent to the first workpiece movement unit 320. The structure of the second workpiece movement unit 336 is the same as the structure of the first workpiece movement unit 320.

Specifically, the second workpiece movement unit 336 includes a grasping part 338 that vertically grasps the frame 15 and a drive part 340 that moves the grasping part 338 in a substantially horizontal direction. A slit-shaped opening 340a that is long in the first direction is formed in the upper surface of the drive part 340 and the drive part 340 moves the grasping part 338 along this opening 440a.

Around the second workpiece movement unit 336, a second temporary putting base 342 having the same structure as the first temporary putting base 326 is disposed. That is, the second temporary putting base 342 includes a pair of guide parts 342a that are each long in the first direction and a base part 342b that is long in the second direction, which is perpendicular to the first direction and is horizontal. The pair of guide parts 342a are coupled through the base part 342b in such a manner that the longitudinal directions thereof are parallel to each other.

The second temporary putting base 342 is supported by a second temporary putting base movement part 344 that moves this second temporary putting base 342 in the second direction and the vertical direction. The second temporary putting base movement part 344 includes a guide rail 346 that is long in the second direction. A moving member 348 is slidably attached to the guide rail 346.

A nut part (not illustrated) is disposed on the moving member 348 and a ball screw (not illustrated) substantially parallel to the guide rail 346 is screwed to this nut part. A pulse motor 350 is coupled to one end of the ball screw. When the ball screw is rotated by the pulse motor 350, the moving member 348 moves in the second direction along the guide rail 346.

The base part 342b of the second temporary putting base 342 is fixed to the upper part of the moving member 348 with the intermediary of a raising-lowering mechanism 352 formed of an air cylinder and so forth. Thus, the second temporary putting base 342 moves in the second direction together with the moving member 348 and the raising-lowering mechanism 352 and moves up and down by the raising-lowering mechanism 352. The second temporary putting base movement part 344 is configured to be capable of moving the second temporary putting base 342 between the second position and the first position adjacent to this second position.

Figure 20:
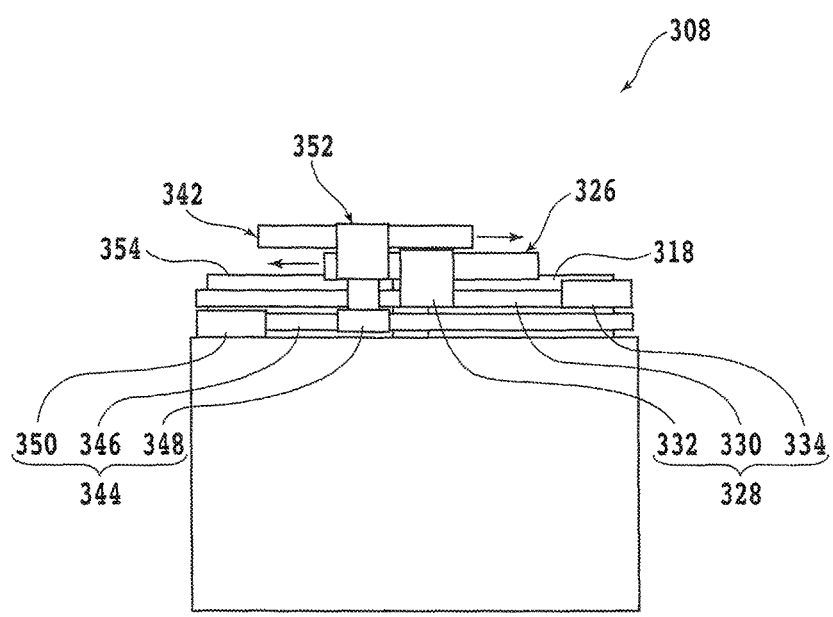
FIG. 20 is a side view schematically illustrating how a first temporary putting base and a second temporary putting base of the stock unit according to Embodiment 3 are moved in a second direction and the positions of the first temporary putting base and the second temporary putting base are interchanged.

FIG. 20 is a side view schematically illustrating how the first temporary putting base 326 and the second temporary putting base 342 are moved in the second direction and the position of the first temporary putting base 326 and the position of the second temporary putting base 342 are interchanged. When the position of the first temporary putting base 326 and the position of the second temporary putting base 342 are interchanged, first, the second temporary putting base 342 is raised by the raising-lowering mechanism 352. Specifically, the second temporary putting base 342 is positioned to a rising position at which the height of the lower end of the second temporary putting base 342 is higher than the height of the upper end of the first temporary putting base 326.

Thereafter, in the state in which the second temporary putting base 342 is positioned at the rising position, the second temporary putting base 342 is moved to the first position side by the second temporary putting base movement part 344. Furthermore, at the same timing, the first temporary putting base 326 is moved to the second position side by the first temporary putting base movement part 328. In FIG. 20, how the first temporary putting base 326 is moved from the first position to the second position and the second temporary putting base 342 is moved from the second position to the first position is illustrated.

After the movement of the first temporary putting base 326 and the second temporary putting base 342 is completed, the second temporary putting base 342 is lowered by the raising-lowering mechanism 352 and the second temporary putting base 342 is positioned to a reference position at which the height of the lower end of the second temporary putting base 342 is substantially equal to the height of the lower end of the first temporary putting base 326. As above, in the stock unit 308, the first temporary putting base 326 and the second temporary putting base 342 can be moved to be interchanged between the first position and the second position by the first temporary putting base movement part 328 and the second temporary putting base movement part 344.

A workpiece storage member holding base 354 that is raised and lowered by a ball-screw-type second raising-lowering mechanism, not illustrated, is disposed in a position facing the second position where the second workpiece movement unit 336 is disposed. The workpiece storage member 38 of the automated workpiece conveying vehicle 10 or the automated workpiece conveying vehicle 210 (hereinafter referred to as the automated workpiece conveying vehicle 10 or the like) is placed on an upper surface of the workpiece storage member holding base 354. As illustrated in FIG. 18, an opening 316b is defined in a ceiling 316a of the casing 316 and extends vertically therethrough in a region directly above the workpiece storage member holding base 354. The opening 316b is of such a shape and size that allow the workpiece storage member 38 placed on the workpiece storage member holding base 354 to pass therethrough.

A control apparatus 362 for controlling operation of the stock unit 308 is connected to constituent elements such as the second raising-lowering mechanism that raises and lowers the cassette holding base 318, the first workpiece movement unit 320, the first temporary putting base movement part 328, the second workpiece movement unit 336, the second temporary putting base movement part 344, the raising-lowering mechanism 352, and the second raising-lowering mechanism that raises and lowers the workpiece storage member holding base 354. Typically, the control apparatus 362 is formed of a computer including a processing apparatus such as a CPU and a storing apparatus such as a flash memory, and functions of the control apparatus 362 are implemented by causing the processing apparatus and so forth to operate in accordance with software stored in the storing apparatus.

A receiver 364 that receives a signal for control (control signal) transmitted from the control unit 12 of the conveyance system and a transmitter 366 that transmits a signal for notification (notification signal) to the control unit 12 are further connected to the control apparatus 362. The control apparatus 362 controls the operation of the stock unit 308 based on the signal received by the receiver 364. Furthermore, the control apparatus 362 transmits the necessary signal to the control unit 12 through the transmitter 366.

Next, operation of the stock unit 308 according to the present embodiment will be described. FIG. 21A, FIG. 21B, FIG. 22A, and FIG. 22B are plan views schematically illustrating an example of operation of the stock unit 308. In the present embodiment, the description will be made about operation in the case in which the first temporary putting base 326 is positioned at the first position and the second temporary putting base 342 is positioned at the second position. However, operation in the case in which the first temporary putting base 326 is positioned at the second position and the second temporary putting base 342 is positioned at the first position is also the same.

For example, the automated workpiece conveying vehicle 10 or the like places the workpiece storage member 38 in which the workpiece 11 (frame 15) after processing is housed on the workpiece storage member holding base 354. On the cassette holding base 318, the cassette 20 in which the workpiece 11 (frame 15) before processing is housed is placed in advance.

Figure 21A:
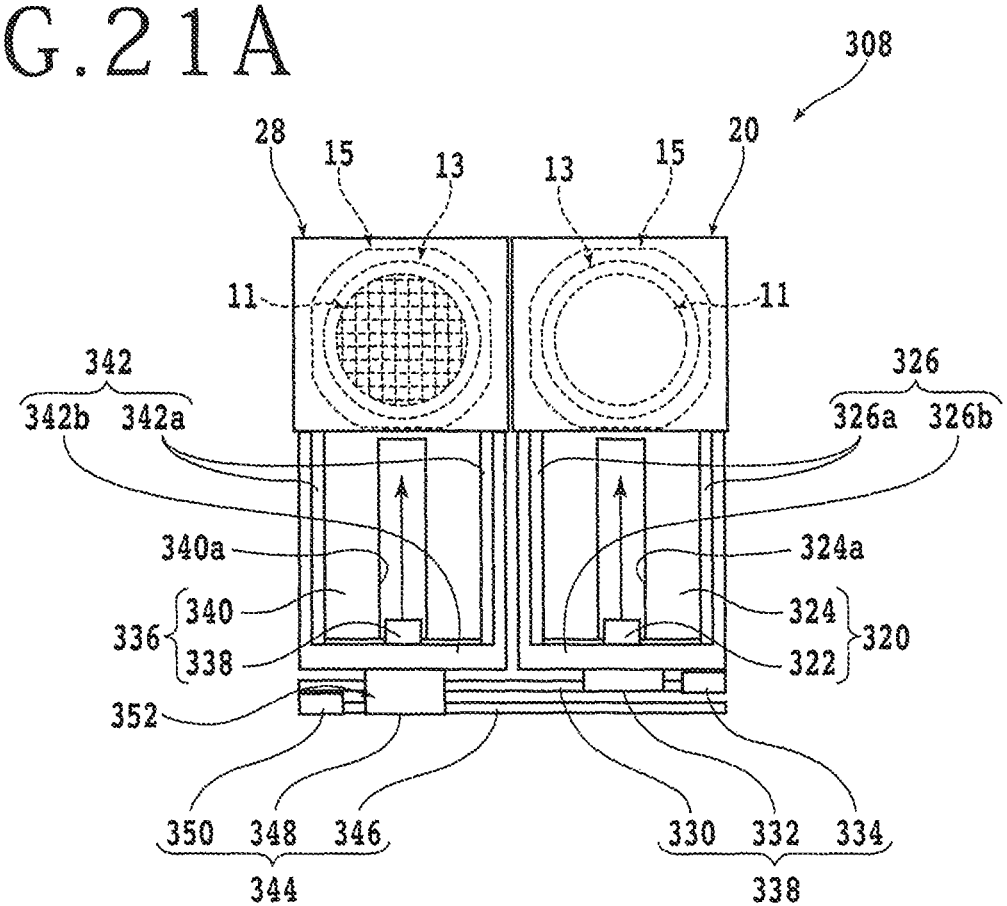
FIG. 21A and FIG. 21B are plan views schematically illustrating an example of operation of the stock unit according to Embodiment 3.

Thereafter, as illustrated in FIG. 21A, the grasping part 322 is brought close to the cassette 20 on the cassette holding base 318 and the frame 15 housed in the cassette 20 is grasped by the grasping part 322. At the same timing, the grasping part 338 is brought close to the workpiece storage member 38 on the workpiece storage member holding base 354 and the frame 15 housed in the workpiece storage member 38 is grasped by the grasping part 338.

Figure 21B:
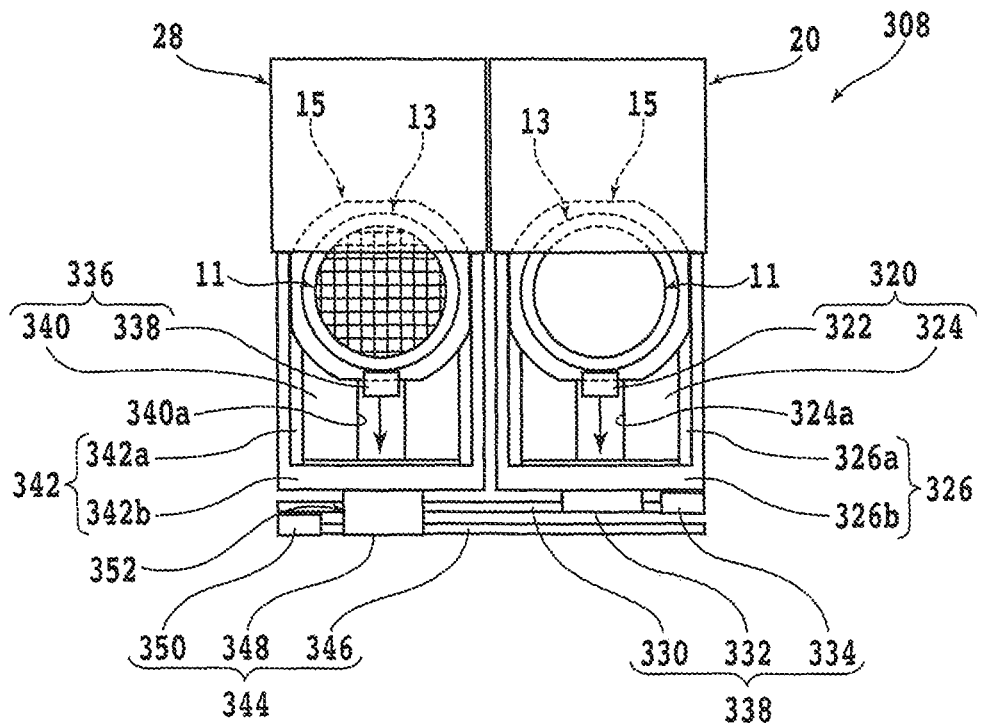

After the frame 15 in the cassette 20 is grasped by the grasping part 322, the grasping part 322 is brought further away from the cassette holding base 318 as illustrated in FIG. 21B. Similarly, after the frame 15 in the workpiece storage member 38 is grasped by the grasping part 338, the grasping part 338 is brought further away from the workpiece storage member holding base 354 as illustrated in FIG. 21B. Thereby, the workpiece 11 before processing is drawn out from the cassette 20 to the first temporary putting base 326, and the workpiece 11 after processing is drawn out from the workpiece storage member 38 to the second temporary putting base 342.

Figure 22A:
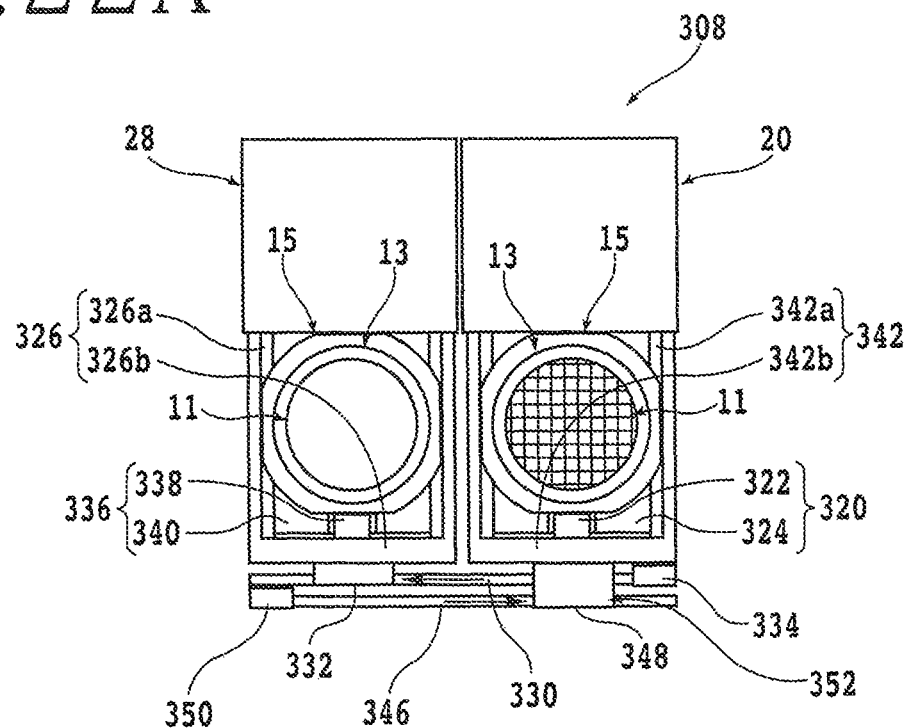
FIG. 22A and FIG. 22B are plan views schematically illustrating the example of the operation of the stock unit according to Embodiment 3.

Next, as illustrated in FIG. 22A, the first temporary putting base 326 and the second temporary putting base 342 are moved to be interchanged between the first position and the second position. Specifically, the second temporary putting base 342 is raised by the raising-lowering mechanism 352 and is positioned to the rising position. Then, the second temporary putting base 342 is moved toward the first position side along the second direction.

Furthermore, at the same timing, the first temporary putting base 326 is moved toward the second position side along the second direction. After the movement of the first temporary putting base 326 and the second temporary putting base 342 is completed, the second temporary putting base 342 is lowered by the raising-lowering mechanism 352 and is positioned to the reference position. As a result, the first temporary putting base 326 is positioned to the second position facing the workpiece storage member holding base 354 and the second temporary putting base 342 is positioned to the first position facing the cassette holding base 318.

Figure 22B:
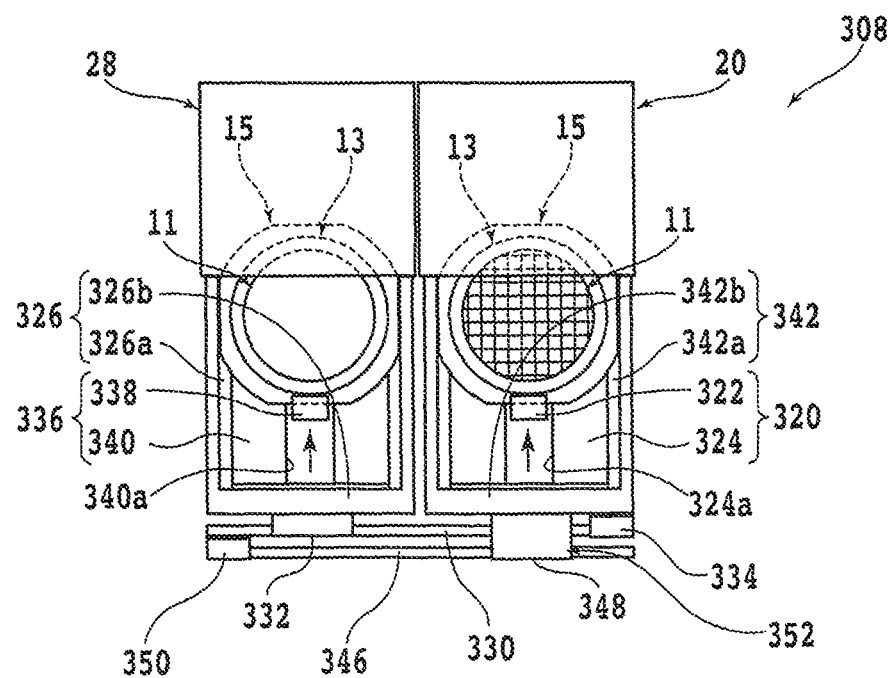

Thereafter, as illustrated in FIG. 22B, the frame 15 on the first temporary putting base 326 is grasped by the grasping part 338 and the grasping part 338 is brought close to the workpiece storage member 38 on the workpiece storage member holding base 354. Thereby, the frame 15 that supports the workpiece 11 before processing and is on the first temporary putting base 326 is housed in the workpiece storage member 38 on the workpiece storage member holding base 354.

At the same timing, the frame 15 on the second temporary putting base 342 is grasped by the grasping part 322, and the grasping part 322 is brought close to the cassette 20 on the cassette holding base 318. Thereby, the frame 15 that supports the workpiece 11 after processing and is on the second temporary putting base 342 is housed in the cassette 20 on the cassette holding base 318.

The automated workpiece conveying vehicle 10 or the like conveys the workpiece storage member 38 from the workpiece storage member holding base 354 after the frame 15 on the first temporary putting base 326 has been stored in the workpiece storage member 38 on the workpiece storage member holding base 354. Through the above, the workpiece 11 after processing can be conveyed from the automated workpiece conveying vehicle 10 or the like to the stock unit 308 and the workpiece 11 before processing can be conveyed from the stock unit 308 to the automated workpiece conveying vehicle 10 or the like.

The first temporary putting base 326 and the second temporary putting base 342 have the same functions and the frame 15 carried out from the cassette 20 can be temporarily put on either of the first temporary putting base 326 or the second temporary putting base 342. For example, when the second temporary putting base 342 is positioned at the first position, the frame 15 carried out from the cassette 20 is temporarily put on the second temporary putting base 342.

Furthermore, the above-described first workpiece movement unit 320 moves the workpiece 11 between the first temporary putting base 326 or the second temporary putting base 342 positioned at the first position and the cassette holding base 318 (cassette 20). Similarly, the second workpiece movement unit 336 moves the workpiece 11 between the second temporary putting base 342 or the first temporary putting base 326 positioned at the second position and the workpiece storage member holding base 354 (workpiece storage member 38).

The present invention is not limited to the description of the above-described embodiments and can be carried out with various changes. For example, the conveyance passage 6 may have a space (waiting region) for allowing two automated workpiece conveying vehicles 10 or the like to pass each other. In addition, the conveyance passage 6 may be set as what is called a one-way passage on which only traveling of the automated workpiece conveying vehicle 10 or the like in one direction is permitted. In this case, the conveyance passage 6 for outward traveling and the conveyance passage 6 for homeward traveling may be set on a cutting apparatus (processing apparatus).

Moreover, in the above-described embodiments, the information providing part 102b such as an identification code or wireless tag is set on the passage part 102. However, it is also possible to attach an information providing part to the guide part 104. In this case, it is preferable to attach the information providing part to a wall surface of the inside of the guide part 104, the upper end part of the guide part 104, or the like, for example.

Besides, structures, methods, and so forth relating to the above-described embodiments, modification examples, and so forth can be implemented with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A conveyance system for conveying a workpiece to each of a plurality of processing apparatuses, comprising:
   a conveyance passage disposed in a space directly above one processing apparatus of the plurality of processing apparatuses;
   an automated conveying vehicle for traveling on the conveyance passage, the automated conveying vehicle including a workpiece storage member having a housing space for housing the workpiece therein, a traveling member having a storage space for storing the workpiece storage member therein, a traveling mechanism mounted on the traveling member, a lifting and lowering mechanism disposed in the traveling member for lifting and lowering the workpiece storage member while suspending the workpiece storage member from above, and a receiver for receiving control signals;
   a stock unit including a workpiece storage member holding base for holding the workpiece storage member thereon when the workpiece is transferred from a workpiece stocker housing the workpiece therein to the workpiece storage member of the automated conveying vehicle, and a receiver for receiving control signals; and
   a control unit including a transmitter for transmitting control signals to the processing apparatuses, the automated conveying vehicle, and the stock unit, a receiver for receiving notification signals transmitted from the processing apparatuses, and a control signal generating section for generating control signals to be transmitted from the transmitter,
   wherein the control signal generating section of the control unit generates control signals to be transmitted from the transmitter of the control unit on a basis of notification signals received by the receiver of the control unit,
   the transmitter of the control unit transmits the control signals generated by the control signal generating section of the control unit to the processing apparatuses, the automated conveying vehicle, and the stock unit, and
   the automated conveying vehicle travels, while storing the workpiece storage member in the storage space, on the conveyance passage on a basis of control signals received by the receiver, and when the automated conveying vehicle stops in a first vehicle stop region of the conveyance passage above the processing apparatuses or a second vehicle stop region of the conveyance passage above the stock unit, the lifting and lowering mechanism lifts and lowers the workpiece storage member to convey the workpiece storage member between the first vehicle stop region and an inside of the processing apparatus or between the second vehicle stop region and the workpiece storage member holding base of the stock unit.

2. The conveyance system according to claim 1, wherein the conveyance passage is disposed on upper surfaces of the processing apparatuses.

3. A conveyance system for conveying a workpiece to each of a plurality of processing apparatuses, comprising:
   a conveyance passage disposed in a space directly above one processing apparatus of the plurality of processing apparatuses;
   an automated conveying vehicle for traveling on the conveyance passage, the automated conveying vehicle including a workpiece storage member having a housing space for housing the workpiece therein, a traveling member having a storage space for storing the workpiece storage member therein, a traveling mechanism mounted on the traveling member, a lifting and lowering mechanism disposed in the traveling member for lifting and lowering the workpiece storage member while suspending the workpiece storage member from above, and a receiver for receiving control signals.

4. A conveyance system for conveying a workpiece to each of a plurality of processing apparatuses, comprising:
   a conveyance passage disposed in a space directly above one processing apparatus of the plurality of processing apparatuses;
   an automated conveying vehicle for traveling on the conveyance passage, the automated conveying vehicle including a workpiece storage member having a housing space for housing the workpiece therein, a traveling member having a storage space for storing the workpiece storage member therein, a traveling mechanism mounted on the traveling member, a lifting and lowering mechanism disposed in the traveling member for lifting and lowering the workpiece storage member while suspending the workpiece storage member from above, and a receiver for receiving control signals;
   a stock unit including a workpiece storage member holding base for holding the workpiece storage member thereon when the workpiece is transferred from a workpiece stocker housing the workpiece therein to the workpiece storage member of the automated conveying vehicle, and a receiver for receiving control signals; and
   a control unit including a transmitter for transmitting control signals to the processing apparatuses, the automated conveying vehicle, and the stock unit, a receiver for receiving notification signals transmitted from the processing apparatuses, and a control signal generating section for generating control signals to be transmitted from the transmitter.

* * * * *